(12) United States Patent
Nishino et al.

(10) Patent No.: US 8,896,210 B2
(45) Date of Patent: Nov. 25, 2014

(54) PLASMA PROCESSING APPARATUS AND METHOD

(71) Applicants: Tokyo Electron Limited, Tokyo (JP); Tocalo Co., Ltd., Kobe (JP)

(72) Inventors: Masaru Nishino, Miyagi (JP); Masatsugu Makabe, Miyagi (JP); Nobuyuki Nagayama, Miyagi (JP); Tatsuya Handa, Miyagi (JP); Ryotaro Midorikawa, Miyagi (JP); Keigo Kobayashi, Chiba (JP); Tetsuya Niya, Chiba (JP)

(73) Assignees: Tokyo Electron Limited, Tokyo (JP); Tocalo Co., Ltd., Kobe (JP)

( * ) Notice: Subject to any disclaimer, the term of this patent is extended or adjusted under 35 U.S.C. 154(b) by 0 days.

(21) Appl. No.: 13/705,712

(22) Filed: Dec. 5, 2012

(65) Prior Publication Data

US 2013/0162142 A1 Jun. 27, 2013

Related U.S. Application Data

(60) Provisional application No. 61/579,086, filed on Dec. 22, 2011.

(30) Foreign Application Priority Data

Dec. 5, 2011 (JP) .................................. 2011-265897
Nov. 27, 2012 (JP) .................................. 2012-259114

(51) Int. Cl.
*H01J 7/24* (2006.01)
*H05H 1/46* (2006.01)
*H01J 37/32* (2006.01)

(52) U.S. Cl.
CPC ............ *H05H 1/46* (2013.01); *H01J 37/32477* (2013.01); *H01J 37/32495* (2013.01)
USPC .............. 315/111.21; 315/111.51; 118/723 R

(58) Field of Classification Search
CPC ........................................................ H05H 1/46
USPC ..................................................... 315/111.21
See application file for complete search history.

(56) References Cited

U.S. PATENT DOCUMENTS 6,068,784 A * 5/2000 Collins et al. ................... 216/68
7,655,328 B2 * 2/2010 Maeda et al. ................. 428/701
(Continued)

FOREIGN PATENT DOCUMENTS

JP     2000-219574 A     8/2000
JP    -2000-252351      *  9/2000 .............. H01L 21/28
(Continued)

OTHER PUBLICATIONS

International Search Report mailed Feb. 26, 2013 in PCT/JP2012/081424.

*Primary Examiner* — Douglas W Owens
*Assistant Examiner* — Srinivas Sathiraju
(74) *Attorney, Agent, or Firm* — Rothwell, Figg, Ernst & Manbeck, P.C.

(57) ABSTRACT

A plasma processing apparatus includes a processing chamber; a lower electrode serving as a mounting table for mounting thereon a target object; and an upper electrode or an antenna electrode provided to be opposite to the lower electrode. The apparatus further includes a gas supply source for introducing a gas including a halogen-containing gas and an oxygen gas into the processing chamber and a high frequency power supply for applying a high frequency power for generating plasma to at least one of the upper electrode, the antenna electrode, or the lower electrode. Among inner surfaces of the processing chamber which are exposed to the plasma, at least a part of or all of the surfaces between a mounting position of the target object and the upper electrode, or the antenna electrode; or at least a part of or all of the surfaces of the upper electrode or the antenna electrode are coated with a fluorinated compound.

21 Claims, 31 Drawing Sheets

(56) References Cited

U.S. PATENT DOCUMENTS

| | | | |
|---|---|---|---|
| 7,846,291 B2* | 12/2010 | Otsuki | 156/345.1 |
| 7,879,179 B2* | 2/2011 | Otsuki | 156/345.1 |
| 7,968,205 B2* | 6/2011 | Nakano et al. | 428/469 |
| 2007/0092696 A1* | 4/2007 | Tsukatani et al. | 428/148 |
| 2007/0215278 A1* | 9/2007 | Furuse et al. | 156/345.1 |
| 2007/0248832 A1 | 10/2007 | Maeda et al. | |
| 2009/0080136 A1* | 3/2009 | Nagayama et al. | 361/234 |
| 2009/0120790 A1* | 5/2009 | O'Donnell | 204/298.31 |
| 2012/0325406 A1* | 12/2012 | Carducci et al. | 156/345.34 |

FOREIGN PATENT DOCUMENTS

| | | |
|---|---|---|
| JP | 2000-252351 A | 9/2000 |
| JP | 2002-252209 A | 9/2002 |
| JP | 2007-115973 A | 5/2007 |
| JP | 2007-217782 A | 8/2007 |
| JP | 2007-308794 A | 11/2007 |
| JP | 2007-324186 A | 12/2007 |
| JP | 2008-98660 A | 4/2008 |
| JP | 2009-81223 A | 4/2009 |
| JP | 2010-153881 A | 7/2010 |

* cited by examiner

FIG.4

| FILM MATERIAL (NUMBER OF WAFERS) | ICP-MS [E+10 atoms/cm²] | Ave SS(0.06μm up) [Particle count] | EDX Y[%] | EDX Y count | EDX Total count |
|---|---|---|---|---|---|
| Y₂O₃ (25wal) | – | 56 | 46% | 12 | 26 |
| Y₂O₃ (1000wal) | 0.13 | 47 | 91% | 40 | 44 |
| Y₂O₃ (2000wal) | 0.20 | 164 | 83% | 33 | 40 |
| YF₃ (25wal) | 20 | 15 | 0% | 0 | 10 |
| YF₃ (100wal) | 1.2 | 4 | 17% | 1 | 6 |
| YF₃ (500wal) | 0.43 | 4 | 0% | 0 | 6 |
| YF₃ (1000wal) | 0.29 | 6 | 17% | 1 | 6 |
| YF₃ (1500wal) | 0.28 | 3 | 17% | 1 | 6 |
| YF₃ (2000wal) | 0.28 | 13 | – | – | – |

FIG.6

| RARE EARTH OXIDE | DENSITY (g/cm³) | RARE EARTH FLUORIDE | DENSITY (g/cm³) |
|---|---|---|---|
| $Y_2O_3$ | 5.03 | $YF_3$ | 4.01 |
| $CeO_2$ | 7.13 | $CeF_3$ | 6.16 |
| $Sm_2O_3$ | 8.35 | $SmF_3$ | 6.64 |
| $Eu_2O_3$ | 7.42 | $EuF_3$ | 6.79 |
| $Gd_2O_3$ | 7.41 | $GdF_3$ | 7.06 |
| $Dy_2O_3$ | 7.81 | $DyF_3$ | 7.47 |
| $Er_2O_3$ | 8.64 | $ErF_3$ | 8.82 |
| $Yb_2O_3$ | 9.17 | $YbF_3$ | 8.17 |

(1) GINYA ADACHI, SCIENCE OF RARE EARTH, SCIENCE COTERIE (1999)
(2) SAMSONOV, DATA BOOK OF OXIDE,
PHYSIC AND CHEMICAL PROPERTY (1978)

FIG.7

| TEST CONDITION | RING BOTTOM SHIELD | BAFFLE PLATE | DEPOSITION SHIELD LOWER PORTION | SHUTTER | DEPOSITION SHIELD UPPER PORTION |
|---|---|---|---|---|---|
| 1. ENTIRELY EXPOSED TO $Y_2O_3$ | $Y_2O_3$ | $Y_2O_3$ | $Y_2O_3$ | $Y_2O_3$ | $Y_2O_3$ |
| 2. ENTIRELY COVERED | COVERED | COVERED | COVERED | COVERED | COVERED |
| 3. RING BOTTOM SHIELD | $Y_2O_3$ | COVERED | COVERED | COVERED | COVERED |
| 4. BAFFLE PLATE | $Y_2O_3$ | $Y_2O_3$ | COVERED | COVERED | COVERED |
| 5. DEPOSITION SHIELD LOWER PORTION | $Y_2O_3$ | $Y_2O_3$ | $Y_2O_3$ | COVERED | COVERED |
| 6. SHUTTER | $Y_2O_3$ | $Y_2O_3$ | $Y_2O_3$ | $Y_2O_3$ | COVERED |
| 7. DEPOSITION SHIELD UPPER PORTION (SAME AS CONDITION NO.1) | $Y_2O_3$ | $Y_2O_3$ | $Y_2O_3$ | $Y_2O_3$ | $Y_2O_3$ |

<ADHESION STRENGTH TEST>

| TPNo. | $Y_2O_3$ | | $YF_3$ | |
|---|---|---|---|---|
| | BREAKING STRESS (Mpa) | BREAKING RESULT | BREAKING STRESS (Mpa) | BREAKING RESULT |
| 1 | 8.7 | A100% | 11.3 | A100% |
| 2 | 7.4 | A100% | 11.5 | A100% |
| 3 | 11.2 | A100% | 11.4 | A100% |
| 4 | 10.2 | A100% | 8.6 | A100% |
| 5 | 8.0 | A100% | 11.0 | A100% |
| AVERAGE | 9.1 | | 10.8 | |

FILM THICKNESS: 300~350μm

FIG. 13

| FILM MATERIAL (NUMBER OF WAFERS) | ICP-MS [E+10 atoms/cm²] | Ave SS(0.0035μm up) [Particle count] | EDX Y[%] | EDX Y count | EDX Total count |
|---|---|---|---|---|---|
| Y₂O₃ (25wal) | 56 | 10 | 3% | 1 | 33 |
| Y₂O₃ (1000wal) | NA | 7 | 23% | 5 | 22 |
| Y₂O₃ (2000wal) | NA | 55 | 45% | 9 | 20 |
| YF₃ (25wal) | 56 | 13 | 0% | 0 | 37 |
| YF₃ (50wal) | 63 | 9 | 0% | 0 | 40 |
| YF₃ (1000wal) | 70 | 3 | 0% | 0 | 20 |
| YF₃ (2200wal) | 82 | 4 | 10% | 2 | 20 |
| YF₃ (3200wal) | NA | 3 | 3% | 1 | 39 |

FIG. 14

| TEST CONDITION | SHUTTER | DEPOSITION SHIELD | BAFFLE PLATE | UPPER ELECTRODE |
|---|---|---|---|---|
| 1. ENTIRELY EXPOSED TO $Y_2O_3$ | $Y_2O_3$ | $Y_2O_3$ | $Y_2O_3$ | $Y_2O_3$ |
| 2. ENTIRELY COVERED | COVERED | COVERED | COVERED | COVERED |
| 3. SHUTTER | $Y_2O_3$ | COVERED | COVERED | COVERED |
| 4. DEPOSITION SHIELD | $Y_2O_3$ | $Y_2O_3$ | COVERED | COVERED |
| 5. BAFFLE PLATE | $Y_2O_3$ | $Y_2O_3$ | $Y_2O_3$ | COVERED |
| 6. UPPER ELECTRODE (SAME AS CONDITION NO.1) | $Y_2O_3$ | $Y_2O_3$ | $Y_2O_3$ | $Y_2O_3$ |

FIG. 17

| MATERIAL | $Y_2O_3$ | $Dy_2O_3$ | $Gd_2O_3$ | $Sm_2O_3$ | $Yb_2O_3$ |
|---|---|---|---|---|---|
| ABRASION ($\mu$m/h) | 2.7 | 2.0 | 2.4 | 2.8 | 2.0 |

FIG.22

| POROSITY | WHITE MARKS/PEELING |
|----------|---------------------|
| 3% | NO |
| 5% | NO |
| 7% | NO |
| 9% | YES |
| 12% | YES |
| 15% | YES |

PLASMA PROCESSING APPARATUS AND METHOD

CROSS-REFERENCE TO RELATED APPLICATIONS

This application claims priority to U.S. Provisional Application No. 61/579,086 filed Dec. 22, 2011, and further claims priority to Japanese Application Numbers 2011-265897, filed Dec. 5, 2011 and 2012-259114, filed Nov. 27, 2012, the entire contents of each of which are hereby incorporated by reference.

FIELD OF THE INVENTION

The present invention relates to a plasma processing apparatus and method.

BACKGROUND OF THE INVENTION

Recently, a scaling-down has been in progress through a plasma processing, demanding for a line width of 20 nm or less to be formed on a wafer by an etching process. Therefore, a generation of a fine particle having a size, which has been treated as being nonproblematic in a conventional plasma processing, has become problematic. Particularly, for example, if the fine particle having a size of 60 nm or less falls onto a pattern formed on a wafer, a line having a line width of, e.g., 20 nm, becomes short-circuited, or the fine particle hinders a following process such as etching, deposition or the like, so that a line may not be formed. In other words, a so-called killer defect occurs. Hence, a region where designed electrical characteristics are not obtained is generated in the wafer, which leads to a decrease in productivity. Accordingly, in comparison to the conventional case, a recent demand for finer processing and a demand for a reduction and removal of fine particles have been markedly increased.

Generally, a processing chamber of an etching apparatus is made of metal such as aluminum or the like, and inner surfaces of the chamber are exposed to a plasma during plasma processing. Thus, a base material of the chamber wall exposed to the plasma is coated with a plasma-resistant member to suppress a generation of particles caused by the etching of the inner wall of the chamber by the plasma.

As for a plasma-resistant member, a thermal-sprayed film of yttrium oxide $Y_2O_3$ is recently widely used. If a CF-based gas is supplied into the chamber in case of using the thermal-sprayed film of yttrium oxide $Y_2O_3$, yttrium oxide $Y_2O_3$ is consumed by a reaction with the CF-based gas.

Therefore, in Patent Document 1, inner surfaces of a chamber exposed to a plasma are coated with yttrium fluoride $YF_3$ serving as a plasma-resistant member.

Patent Document 1: Japanese Patent Application Publication No. 2002-252209

However, in Patent Document 1, the inner surfaces of the chamber exposed to the plasma are coated with yttrium fluoride in order to solve the problem in which the plasma-resistant member is consumed when a CF-based gas is supplied into the chamber. Further, the technical background of the recent miniaturization technique is completely different from that of Patent Document 1 that has been published more than ten years ago, because the pattern, which is micro-processed in conformity with the recent demand, cannot be formed by the pattern forming technique of Patent Document 1. Therefore, in the case of supplying a plasma gas containing a gas including a CF-based gas and other gases into the chamber, Patent Document 1 does not provide the solution for preventing fine particles from causing a so-called killer defect by suppressing the generation of the fine particles each having a size of about 60 nm or less.

SUMMARY OF THE INVENTION

In view of the above, the present invention provides a plasma processing apparatus and a plasma processing method, capable of suppressing a generation of fine particles during a plasma processing in which a gas including a halogen-containing gas and an oxygen gas is introduced.

In accordance with an aspect of the present invention, there is provided a plasma processing apparatus for generating a plasma of a gas by applying a high frequency power and performing a plasma processing on a target object to be processed by an action of the plasma, including: a depressurizable processing chamber; a lower electrode, provided in the processing chamber, serving as a mounting table for mounting thereon the target object; an upper electrode or an antenna electrode provided at the processing chamber so as to be opposite to the lower electrode; a gas supply source for introducing a gas including a halogen-containing gas and an oxygen gas into the processing chamber; and a high frequency power supply for applying a high frequency power for generating plasma to at least one of the upper electrode, the antenna electrode, or the lower electrode. Among inner surfaces of the processing chamber which are exposed to the plasma, at least a part of or all of the surfaces between a mounting position of the target object and the upper electrode, or the antenna electrode; or at least a part of or all of the surfaces of the upper electrode or the antenna electrode are coated with a fluorinated compound.

A material forming the fluorinated compound may contain any one of Y, Ce, Eu, Sm, Yb, Dy, Gd, Ca, and Mg.

The material forming the fluorinated compound may contain $YF_3$.

An outermost layer of the fluorinated compound may be transformed into a Y—O—F layer having a thickness of 20 nm or less or a layer containing Cl and Br in addition to the Y—O—F layer by the plasma of the gas including the halogen-containing gas and the oxygen gas.

The fluorinated compound may be formed by a thermal spraying, a physical vapor deposition, or a chemical vapor deposition.

The material forming the fluorinated compound may contain no Y.

The material of the fluorinated compound may contain Al or Si.

The fluorinated compound may be directly formed on a metal base, or the fluorinated compound may be formed on an outermost layer through one or more insulating films.

The fluorinated compound may be directly formed on any one of an Al base, an $Y_2O_3$ film, or an $Al_2O_3$ film.

The fluorinated compound may have a film thickness smaller than 300 μm. Further, the fluorinated compound may have a film thickness smaller than 200 μm.

An outermost layer of the fluorinated compound may be melted by an irradiation of energy rays and then crystallized. The irradiation of energy rays may include an irradiation of electron beams or an irradiation of a laser.

Among the inner surfaces of the processing chamber which are exposed to the plasma, a part of or all of the surfaces located between the upper electrode and the baffle plate may be coated with the fluorinated compound.

Among the inner surfaces of the processing chamber which are exposed to the plasma, an inner surface to be coated with the fluorinated compound may be determined by a gap between the mounting table and a ceiling surface of the processing chamber.

A surface of at least one of a deposition shield, a shutter, a baffle plate, or a ring bottom shield provided in the processing chamber, the surface being exposed to the plasma, is coated with the fluorinated compound.

A side surface of an electrostatic chuck on the mounting table may be coated with the fluorinated compound, or the side surface and a top surface of the electrostatic chuck may be coated with the fluorinated compound.

A top surface of a focus ring provided to surround a peripheral portion of the target object mounted on the mounting table may be coated with the fluorinated compound.

Further, in accordance with another aspect of the present invention, there is provided a plasma processing method for a plasma processing apparatus which includes a depressurizable processing chamber; a lower electrode, provided in the processing chamber, serving as a mounting table for mounting thereon a target object to be processed; an upper electrode or an antenna electrode provided in the processing chamber so as to be opposite to the lower electrode; a gas supply source for introducing a gas into the processing chamber; and a high frequency power supply for applying a high frequency power for generating plasma to at least one of the upper electrode, the antenna electrode, or the lower electrode.

The plasma processing method includes: introducing a gas including a halogen-containing gas and an oxygen gas from the gas supplying source into the processing chamber in which, among inner surfaces of the processing chamber which are exposed to the plasma, at least a part of or all of the surfaces between a mounting position of the target object and the upper electrode, or the antenna electrode; or at least a part of or all of the surfaces of the upper electrode or the antenna electrode are coated with a fluorinated compound; supplying the high frequency power for generating plasma from the high frequency power supply into the processing chamber; and generating a plasma of the gas by applying the high frequency power for generating plasma and performing a plasma processing on the target object mounted on the mounting table by an action of the plasma.

EFFECT OF THE INVENTION

As described above, in accordance with the present invention, it becomes possible to suppress the generation of fine particles during the plasma processing in which a gas including a halogen-containing gas and an oxygen gas is introduced.

BRIEF DESCRIPTION OF THE DRAWINGS

FIG. 4 shows analysis results of EDX and ICP-Mass in the first embodiment and in the comparative example.

FIG. 6 shows physical property data of rare earth oxides.

FIG. 7 explains a test for detecting a cause of generation of yttrium Y in the first embodiment.

FIG. 13 shows analysis results of EDX and ICP-Mass in the second embodiment and in the comparative example.

FIG. 14 explains a test for detecting a cause of generation of yttrium Y in the second embodiment.

FIG. 17 shows a plasma resistance of each material.

FIG. 22 is a graph showing porosities and generation of white marks and peeling-off of the thermal-sprayed films of $YF_3$ in one embodiment of the present invention.

DETAILED DESCRIPTION OF THE EMBODIMENTS

Figure 1:
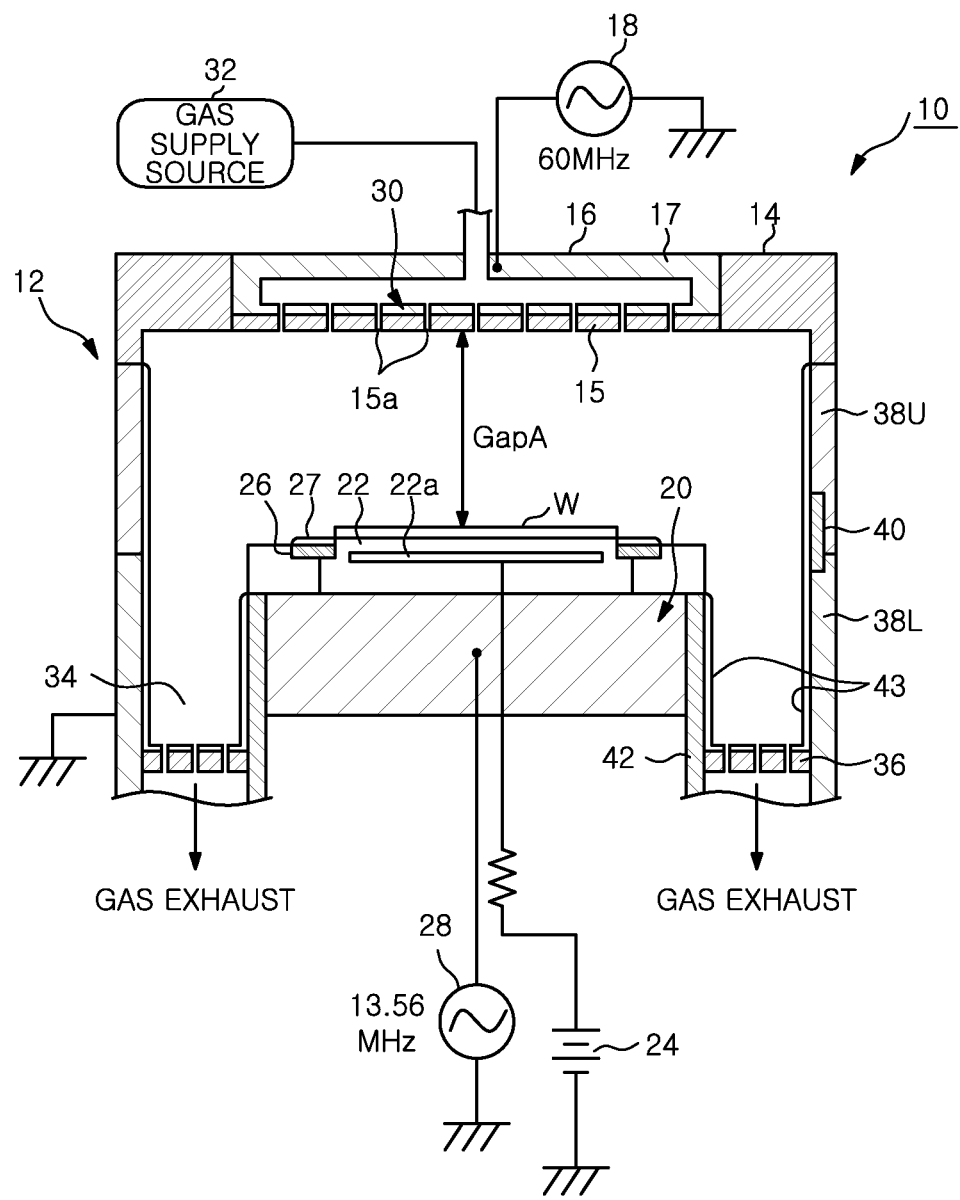
FIG. 1 shows a schematic configuration of a plasma processing apparatus in accordance with a first embodiment of the present invention.

Hereinafter, embodiments of the present invention will be described with reference to the accompanying drawings. Throughout the specification and drawings, like reference numerals will be given to like parts having substantially the same function and configuration, and a redundant description thereof will be omitted.

<Introduction>

Recently, a scaling-down has been in progress through a plasma processing, demanding for a line width of 20 nm or less to be formed on a semiconductor wafer (hereinafter, referred to as "wafer") by an etching process. Therefore, a generation of a fine particle having a size, which has been treated as being nonproblematic in a conventional plasma processing, becomes problematic. Particularly, if the fine particle having a size of 60 nm or less falls onto a pattern formed on a wafer, a line having a line width of, e.g., 20 nm, becomes short-circuited, or the fine particle hinders a following process such as etching, deposition or the like, so that a line may not be formed. In other words, a so-called killer defect occurs. The killer defect could cause a decrease in productivity since a region where designed electrical characteristics are not obtained is generated in the wafer. Accordingly, in comparison to the conventional case, a recent demand for fine processing and a demand for reduction and removal of fine particles have been markedly increased.

During the plasma processing, a chamber is exposed to the plasma. Accordingly, a surface of a base material of a chamber wall, which is exposed to the plasma, is coated with a plasma-resistant member, thus making it possible to suppress a particle generation due to the plasma attack on the chamber wall. As for the plasma-resistant member, there has been used a thermally sprayed film of yttrium oxide $Y_2O_3$.

However, the present inventors have found that at least 50% of the killer defects were identified as defects caused by particles generated from yttria. Therefore, there has been an increase in demand for an improvement in a thermal-sprayed surface of yttrium oxide $Y_2O_3$ of a member in the chamber or a demand for a substitution material for yttria Y.

Hence, in the embodiments of the present invention which will be described hereinafter, there will be described a plasma processing apparatus capable of suppressing the generation of fine particles during a plasma processing in which a gas, including a halogen-containing gas and an oxygen gas, is introduced.

In the following description, yttrium fluoride $YF_3$ will be described as an example of the plasma-resistant member. First, in a first embodiment, there will be described, with reference to FIGS. 2 to 9, a result of a test on particles generated in the case where a thermal-sprayed film of yttrium fluoride $YF_3$ is formed on inner surfaces of the chamber exposed to a plasma in the plasma processing apparatus shown in FIG. 1. Next, in a second embodiment, there will be described, with reference to FIGS. 11 to 15, a result of a test on particles generated in the case where a thermal-sprayed film of yttrium fluoride $YF_3$ is formed on inner surfaces of the chamber exposed to the plasma in the plasma processing apparatus shown in FIGS. 10A and 10B. Finally, with reference to FIGS. 16 to 18, there will be described variations of the thermal-sprayed film of yttrium fluoride $YF_3$ and a material that can be the substitution material for yttrium fluoride $YF_3$.

First Embodiment

<Schematic Configuration of Plasma Processing Apparatus>

First, with reference to FIG. 1, there will be described a schematic configuration of a plasma processing apparatus 10 in accordance with the first embodiment of the present invention. FIG. 1 is a vertical cross sectional view showing a schematic configuration of the plasma processing apparatus 10 in accordance with the first embodiment.

The plasma processing apparatus 10 includes a cylindrical processing chamber 12 made of metal, e.g., aluminum, stainless steel or the like. The processing chamber 12 is grounded. The processing chamber 12 has an upper opening, and an upper electrode 16 is provided at the upper opening via an insulator 14. Accordingly, a cover portion is formed to cover the opening of the processing chamber 12. Further, the upper electrode 16 includes: an electrode plate 15 having a plurality of gas openings 15a in a surface opposite to the mounting table 20 and an electrode support body 17 to which the electrode plate 15 is detachably attached. The electrode support body 17 has a water cooling structure and is made of a conductive material, e.g., aluminum. The electrode plate 15 is made of, e.g., Si, SiC, quartz, or the like. A high frequency power source 18 is connected to the upper electrode 16 via a matching unit (not shown). The high frequency power source 18 applies, to the upper electrode 16, a high frequency power of, e.g., 60 MHz for generating plasma. Accordingly, the high frequency power from the high frequency power source 18 is capacitively applied between the mounting table 20 and a shower head 30.

The high frequency power source 18 is an example of a power source for supplying a high frequency power for generating plasma to the electrode provided in the processing chamber 12. In the present embodiment, the high frequency power is applied to the upper electrode 16. However, the high frequency power for generating plasma may be applied to either the upper electrode 16 or a lower electrode (the mounting table 20).

In the processing chamber 12, the mounting table 20 for mounting thereon a semiconductor wafer W (hereinafter, referred to as "wafer W") is provided. The mounting table is made of, e.g., aluminum, and supported in the processing chamber 12 via an insulating support (not shown). Provided on a top surface thereof is an electrostatic chuck 22 for holding the wafer W by an electrostatic adsorptive force. The wafer W is electrostatically adsorbed onto the electrostatic chuck 22 by a Coulomb force generated with a DC voltage applied from a DC power supply 24 to an electrode plate 22a in the electrostatic chuck 22. The wafer W is mounted on the electrostatic chuck 22. A focus ring 26 is provided to surround the peripheral portion of the wafer W. If the focus ring 26 is made of quartz, a thermal-sprayed film 27 of yttrium fluoride $YF_3$ is formed on a top surface of the focus ring 26 exposed to the plasma.

A high frequency power source 28 is connected to the mounting table 20 via a matching unit (not shown). The high frequency power source 28 applies a bias high frequency power of, e.g., about 13.56 MHz, to the mounting table 20. Therefore, the mounting table 20 also serves as the lower electrode. The upper electrode 16 provided at the ceiling portion of the processing chamber 12 has a plurality of gas openings 15a. The plasma gas supplied from a gas supply source 32 is supplied into the processing chamber 12 through the gas openings 15a. Accordingly, the upper electrode 16 serves as the shower head 30.

A gas exhaust path 34 is formed between a sidewall of the processing chamber 12 and a sidewall of the mounting table 20. A baffle plate 36 for gas flow control is provided in the gas exhaust path 34. The gas exhaust path 34 is connected to a gas exhaust unit (not shown), and a pressure in a processing space in the processing chamber 12 is decreased to a predetermined vacuum level by using a vacuum pump.

Attached to the sidewall of the processing chamber 12 are a deposition shield upper portion 38U, a deposition shield lower portion 38L, and a shutter 40 for opening and closing for the loading/unloading of the wafer W. The deposition shield upper portion 38U is attached to the sidewall of the processing chamber which is located between the upper electrode 16 and the mounting position of the wafer W, and the deposition shield lower portion 38L is attached to the sidewall of the processing chamber which is located below the mounting position of the wafer W. A ring bottom shield 42 is attached to the sidewall of the mounting table 20. A thermally-sprayed film 43 of $YF_3$ is formed on the surfaces of the deposition shield upper portion 38U, the deposition shield lower portion 38L, the shutter 40, and the ring bottom shield 42. In the present embodiment, the deposition shield is divided into the deposition shield upper portion 38U and the deposition shield lower portion 38L. However, the deposition shield may not be divided into an upper and a lower portion.

In the processing chamber 12, a vertical RF electric field is formed in a plasma generation space between the shower head 30 and the mounting table 20 by the high frequency power source 18. A high-density plasma is generated near the surface of the electrostatic chuck 22 by the high frequency discharge. Due to the action of the plasma thus generated, the wafer W is etched in the processing chamber 12.

<Examination of Particle Generation>

(The Number of Particles)

Figure 2A:
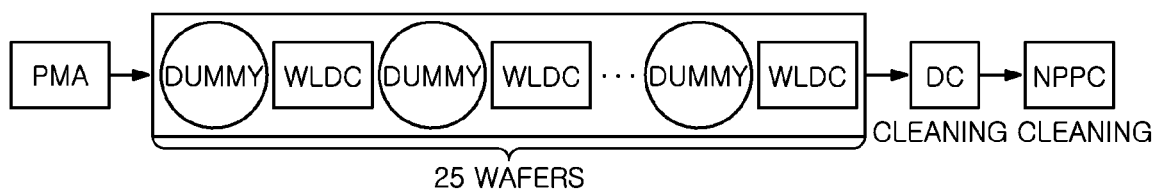
FIG. 2A is an explanatory view showing a sequence of a plasma processing in the first embodiment.

The number of particles being generated was observed by using the plasma processing apparatus 10 having a related configuration. First, the maintenance of the processing chamber, which included a wet cleaning in the processing chamber or the like, was performed; and then, a set process of a plasma processing on a dummy wafer and a waferless dry cleaning (WLDC) was repeated for 25 wafers, as shown in FIG. 2A. Next, a general dry cleaning (DC) using a cleaning wafer or the like was performed, and a non plasma particle cleaning (NPPC) was performed. NPPC was carried out to clean the processing chamber by intermittently applying a high voltage from a high voltage power source into the processing chamber while introducing a purge gas into the vacuum apparatus and exhausting the vacuum apparatus. The recipe for the dummy wafer had two steps. As for the processing gases for the dummy wafers, CF-based gas/CHF-based gas/Ar gas/$O_2$ gas were supplied in the first step and $N_2$/$N_2$ gases were supplied in the second step. In WLDC and DC, Ar/$O_2$ gases were supplied. Hence, the surface of the processing chamber 12 which was exposed to the plasma was repetitively subjected to a cycle of fluorination, reduction, and oxidation.

Figure 2B:
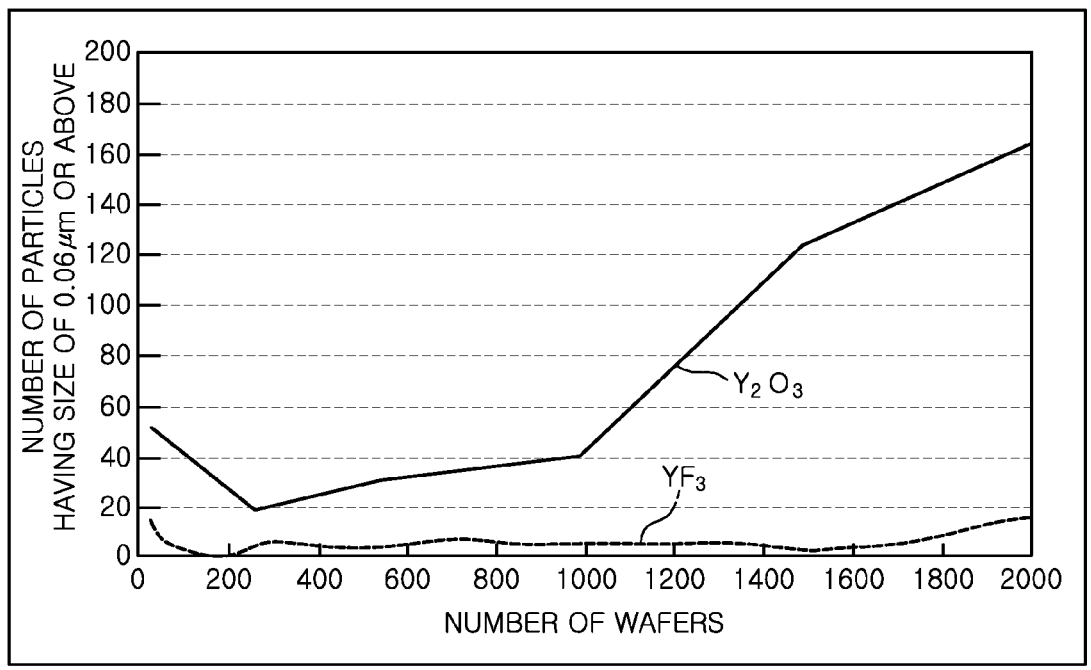
FIG. 2B is a graph comparing a relationship between the number of particles and the number of processed wafers in the first embodiment with that in a comparative example.
Figure 3:
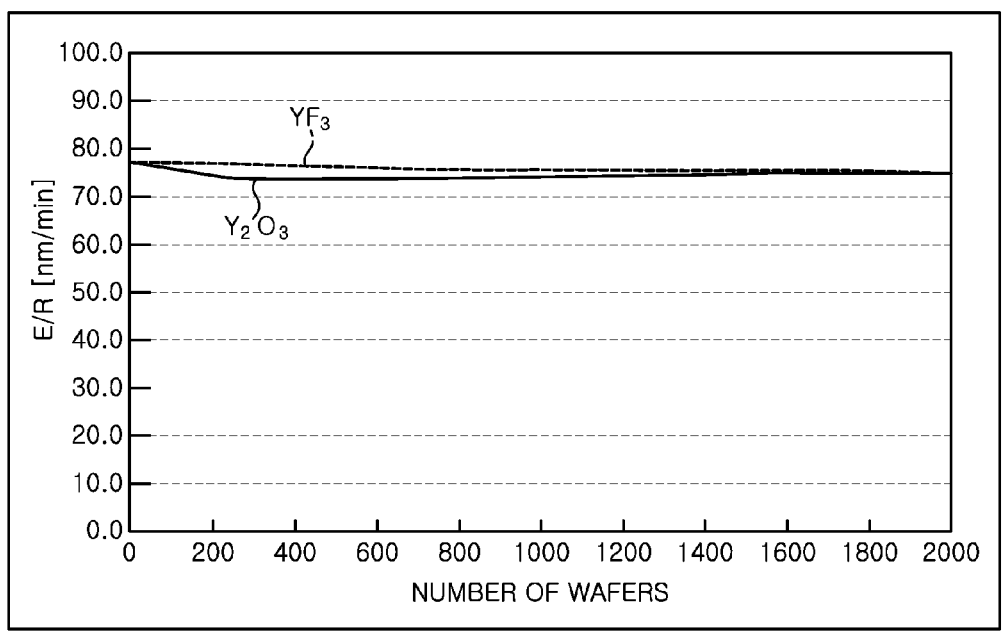
FIG. 3 is a graph comparing a relationship between an etching rate and the number of processed wafers in the plasma processing apparatus of the first embodiment with that in the comparative example.

The result of repetition of the above plasma processing for 2000 wafers is shown in a graph of FIG. 2B. A horizontal axis and a vertical axis in the graph indicate the number of wafers and the number of particles having a size of 0.06 µm or above, respectively.

According to this result, in the case of the thermal-sprayed film of yttrium oxide $Y_2O_3$, the number of particles having a size of 0.06 µm or above was sharply increased when the number of processed wafers exceeded about 1000. In contrast, in the case of the thermal-sprayed film of yttrium fluoride $YF_3$, the number of particles having a size of 0.06 µm or above remained stably about 1 to 3 without being sharply increased even when the number of processed wafers reached about 2000. This result shows that the particle level in the thermal-sprayed film of yttrium fluoride $YF_3$ was more stable than that in the thermal-sprayed film of yttrium oxide $Y_2O_3$. In the case of using yttrium oxide $Y_2O_3$, the number of particles was rapidly increased particularly when the number of processed wafers exceeded about 1000. However, in the case of using yttrium fluoride $YF_3$, the number of particles was stabilized at a low level even when the number of processed wafers exceeded about 1000.

(Etching Rate)

Next, it was examined whether or not the etching rate of the plasma processing was different between the case of using yttrium fluoride $YF_3$ for a thermal-sprayed film and the case of using yttrium oxide $Y_2O_3$ for a thermal-sprayed film. The result thereof is shown in a graph of FIG. 3. A horizontal axis and a vertical axis in this graph indicate the number of particles and an etching rate E/R (nm/min), respectively. Here, an SiC film was etched.

According to this result, the etching rate E/R in the case of using yttrium fluoride $YF_3$ for a thermal-sprayed film was substantially the same as that in the case of using yttrium oxide $Y_2O_3$ for a thermal-sprayed film. Therefore, the increase in the etching rate E/R by the supply of a fluoride-based gas from yttrium fluoride $YF_3$ to the wafer was not monitored. Hence, in the case of using the thermal-sprayed film of yttrium fluoride $YF_3$, it is unnecessary to change the process recipe created for the case of using the thermal-sprayed film of yttrium oxide $Y_2O_3$. Accordingly, it has been found that the process recipe created for the case of using the thermal-sprayed film of yttrium oxide $Y_2O_3$ may be used as the process recipe for the case of using the thermal-sprayed film of yttrium fluoride $YF_3$.

(ICP-MASS and EDX Analysis)

Next, the case of using yttrium fluoride $YF_3$ to form a thermal-sprayed film and the case of using yttrium oxide $Y_2O_3$ to form a thermal-sprayed film were analyzed by using an ICP-Mass (inductively coupled plasma mass spectrometry) and EDX (energy dispersive x-ray spectroscopy). The analysis result is shown in FIG. 4.

In the ICP-Mass, the total number of particles on the wafer can be obtained by an analysis method for measuring the contamination of the wafer surface by dissolving the wafer surface. However, it is difficult to obtain the composition of an individual particle.

From the ICP-Mass analysis result, it has been found that the analysis values were not greatly varied either in the case of using yttrium fluoride $YF_3$ to form a thermal-sprayed film or in the case of using yttrium oxide $Y_2O_3$ to form a thermal-sprayed film. Accordingly, it has been found that the total number of particles on the wafer surface was not greatly changed even when the number of processed wafers was increased.

In regard to such results, in both of the case of using yttrium fluoride $YF_3$ and the case of using yttrium oxide $Y_2O_3$ to form a thermal-sprayed film, since the thermal spraying method and the film thickness are the same, the surface areas of the thermal spraying for both cases are the same. If the surface areas are the same, the contamination levels, measured when the surfaces of the thermal-sprayed films are sputtered by the plasma generated by the high frequency power, are generally the same and hardly changed. Further, since the ICP-Mass can detect yttrium Y of an atom level, such results may be obtained by detecting yttrium Y of such a small molecule or an atom level.

Meanwhile, in the EDX, particles having a size of 0.06 µm or above are analyzed by radiating X-rays to the particles, and the composition of the particles can be obtained. From the analysis result of FIG. 4, in the case of using yttrium oxide $Y_2O_3$ to form a thermal-sprayed film, the number of particles containing yttrium Y in the total number of particles (i.e., contribution of Y) was found to be increased as the number of processed wafers was increased.

On the other hand, in the case of using yttrium fluoride $YF_3$ to form a thermal-sprayed film, it has been found that the number of particles containing yttrium Y was not increased even when the number of processed wafers was increased. No yttrium Y existed on the wafer, or if any, a single yttrium Y existed on a single wafer. Therefore, it was proved that when yttrium fluoride $YF_3$ was used to form a thermal-sprayed film, the total number of particles was small and, particularly, the number of yttrium Y in the particles was considerably small.

The average (Ave SS Result) shown in the center of the graph indicates the average number of particles having a size of 0.06 µm or above detected on ten wafers. For example, in the case of processing $25^{th}$ wafer while yttrium fluoride $YF_3$ was used to form a thermal-sprayed film, the total number of particles "10" indicates the total number of particles detected on $25^{th}$ wafer while the total number of particles detected on ten wafers was 153.

Accordingly, when yttrium fluoride $YF_3$ was used to form a thermal-sprayed film, the number of particles containing yttrium Y in the total number of particles (i.e., contribution of Y) was not increased even if the number of processed wafers was increased, and the number of particles was considerably small, compared to when yttrium oxide $Y_2O_3$ was used to form a thermal-sprayed film. Further, the number of particles containing yttrium Y on a single wafer was 0 or 1 in any of 2000 processed wafers.

(Principle of Yttrium Y Particle Generation)

Figure 5:
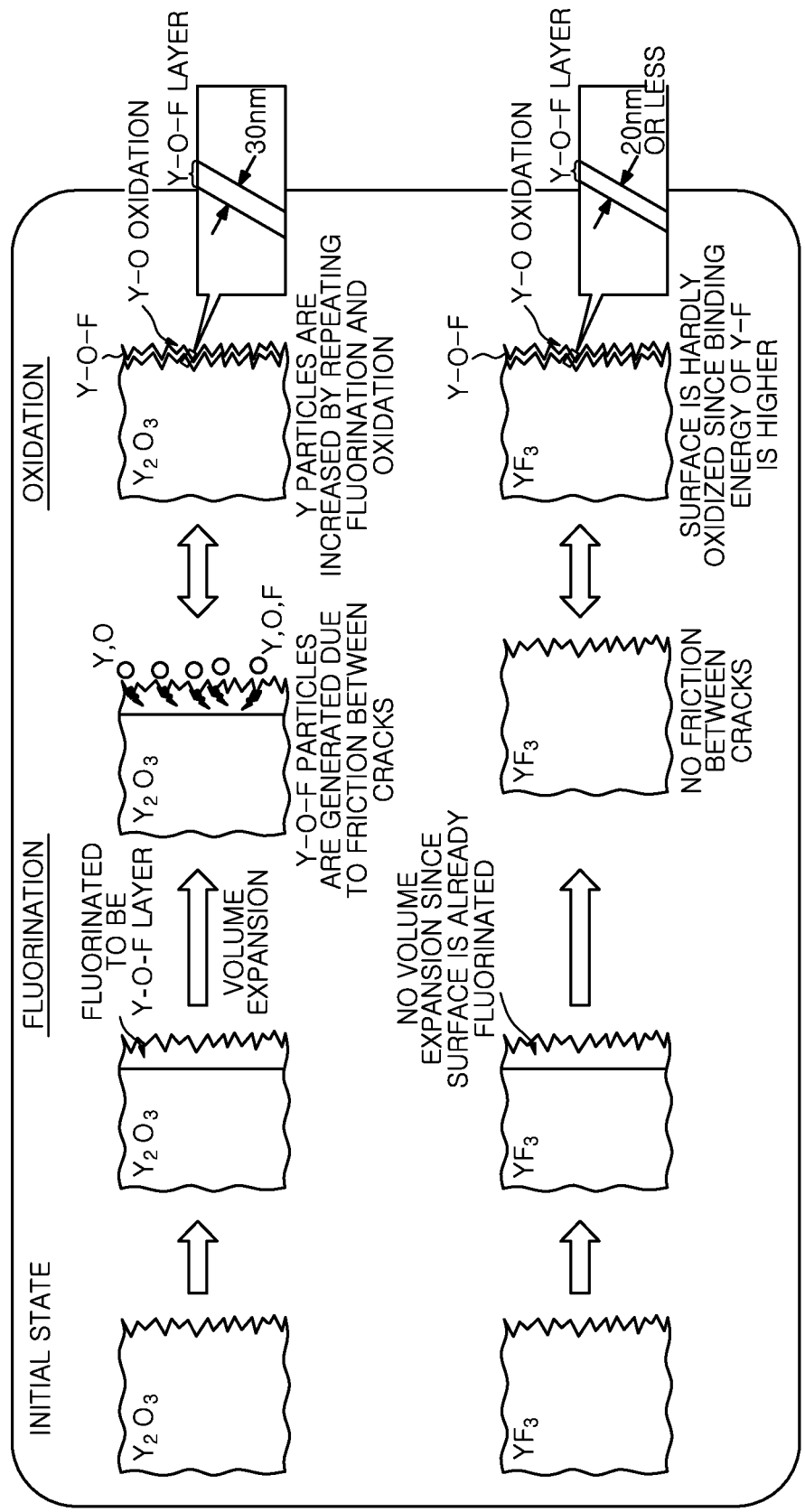
FIG. 5 explains a principle of a particle generation of yttrium Y.

Here, the principle of yttrium Y particle generation will be described with reference to FIGS. 5A and 5B. The upper image in FIG. 5 shows the case where a thermal-sprayed film of yttrium oxide $Y_2O_3$ is formed on inner surfaces of the processing chamber which are exposed to the plasma, and the lower image in FIG. 5 shows the case where a thermal-sprayed film of yttrium fluoride $YF_3$ is formed on the inner surfaces of the processing chamber which are exposed to the plasma. Both images show how the outermost layer is transformed (from left to right) by the plasma of the halogen-containing gas (here, a fluorine-based gas).

If yttrium oxide $Y_2O_3$ shown in the upper image is exposed to the fluorine-based plasma, yttrium oxide $Y_2O_3$ is reduced by the fluorine in the plasma since yttrium oxide $Y_2O_3$ is an oxide film. As a result, the outermost layer is fluorinated and becomes a Y—O—F layer.

Referring to the physical property data of rare earth oxides in FIG. 6, the rare earth oxide $Y_2O_3$ has a density of 5.03 (g/cm$^3$), whereas fluorinated rare earth $YF_3$ has a density of 4.01 (g/cm$^3$). As can be seen from this physical property data, when the oxide film of yttria is fluorinated to be transformed into a fluorine containing compound, the density of the transformed layer is decreased. At this time, the volume of the transformed Y—O—F layer is expanded, so that the surface of the Y—O—F layer is distorted. Hence, a friction develops between cracks, thereby generating particles containing Y—O—F. In this state, oxidation and fluorination are repeated and, hence, particles containing yttrium Y are generated.

On the other hand, since the surface of the yttrium fluoride $YF_3$ shown in the lower image has been already fluorinated, the volume of the outermost layer is not expanded even if the outermost surface is fluorinated by the exposure of the surface of yttrium fluoride $YF_3$ to the fluorine-based plasma. Hence, no friction develops between the cracks on the surface of yttrium fluoride $YF_3$. Further, the binding energy of Y—F is higher than that of Y—O, so that the surface of $YF_3$ is hardly oxidized.

Figure 19A:
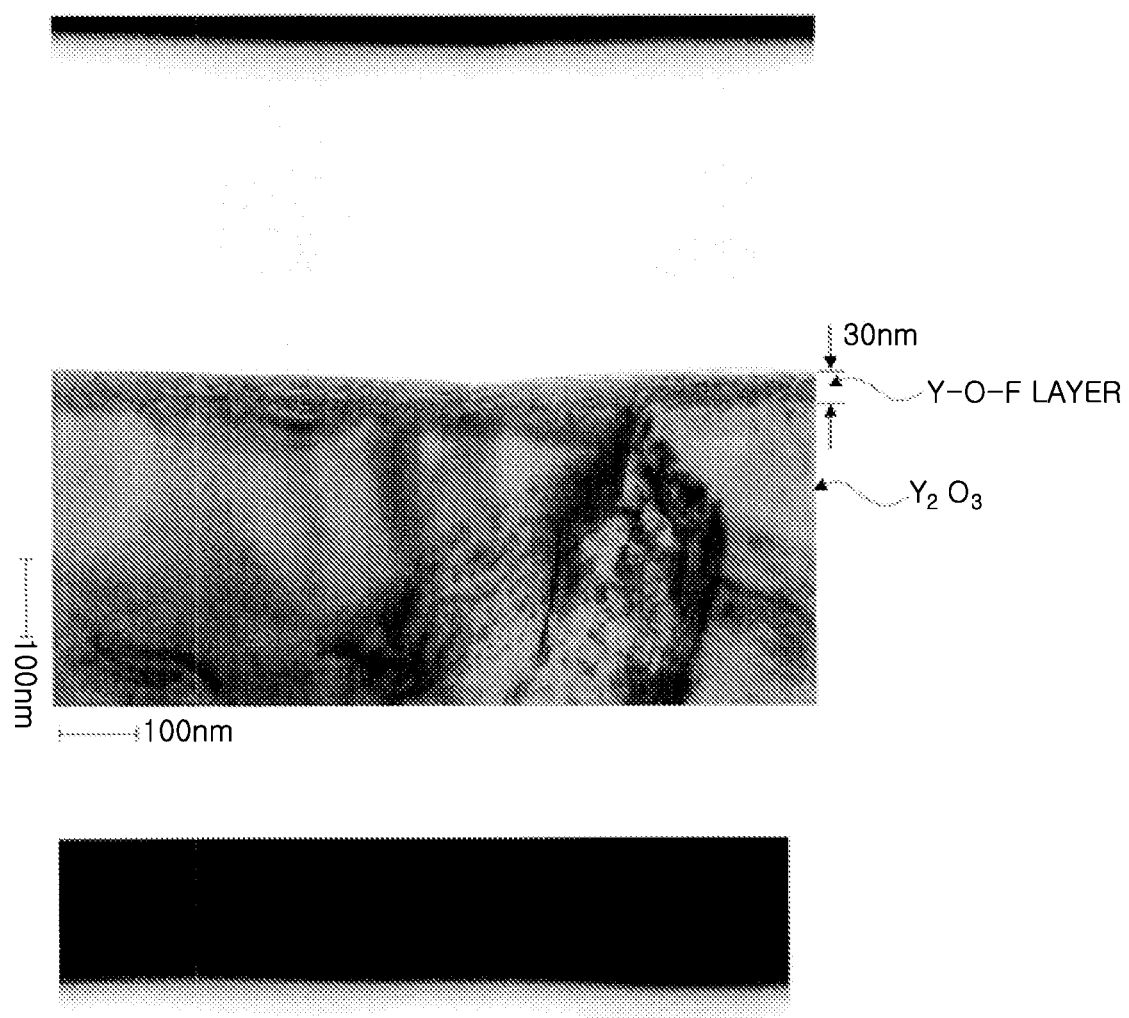
FIGS. 19A and 19B show transmission electron microscopy TEM images of Y—O—F layers formed on the surfaces of the thermal-sprayed films of $YF_3$ and $Y_2O_3$.
Figure 19B:
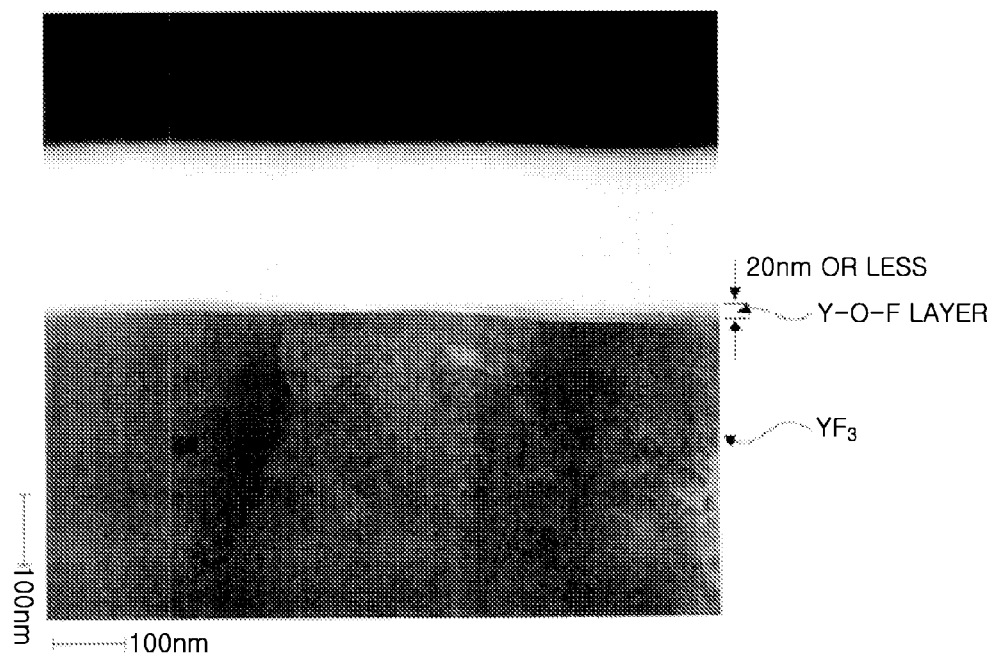

According to the test result obtained by using a transmission electron microscope TEM which was performed by the present inventors, the thickness of the Y—O—F layer transformed from yttrium oxide $Y_2O_3$ shown in FIG. 19A was about 30 nm, whereas the thickness of the Y—O—F layer transformed from yttrium fluoride $YF_3$ shown in FIG. 19B was about 20 nm or less. This test result shows that yttrium fluoride $YF_3$ is not easily transformed and more stable compared to yttrium oxide $Y_2O_3$. Besides, it has been found that yttrium fluoride $YF_3$ hardly generates particles.

From the above, it was experimentally and theoretically found that when the thermal-sprayed film of yttrium oxide $Y_2O_3$ was exposed to the fluorine-based plasma, the friction developed between the cracks and this caused a generation of dust containing yttrium Y. However, when the surface of yttrium fluoride $YF_3$ was exposed to the fluorine-based plasma, no friction occurred between the cracks and this caused no generation of dust.

Further, as described above, in the case of yttrium fluoride $YF_3$, the Y—O—F layer has a thickness of 20 nm or less, so that the particles generated from the transformed layer has a size less than 20 nm. In the recent fine processing, the particles having a size less than 20 nm do not cause so-called killer defects which cause the line having a line width of, e.g., 20 nm to be short-circuited.

(Detection of Causes of Generation of Yttrium Yttria Y)

Next, the present inventors have examined causes of generation of yttrium Y in such a manner that the thermal-sprayed films of yttrium oxide $Y_2O_3$, which were formed on the plasma-resistant members in the plasma processing apparatus 10, such as the deposition shield upper portion, the shutter, the deposition shield lower portion, the baffle plate, and the ring bottom shield, were individually exposed by removing covers therefrom.

In other words, as shown in FIG. 7, the thermal-sprayed films of yttrium oxide $Y_2O_3$ were exposed in the following order: (1) the entire yttrium oxide $Y_2O_3$ surface was exposed; (2) the entire yttrium oxide $Y_2O_3$ surface was covered so as not to be exposed; (3) only the yttrium oxide $Y_2O_3$ surface of the ring bottom shield was exposed from the state of (2); (4) the yttrium oxide $Y_2O_3$ surface of the baffle plate was further exposed from the state of (3); (5) the yttrium oxide $Y_2O_3$ surface of the deposition shield lower portion was further exposed from the state of (4); (6) the yttrium oxide $Y_2O_3$ surface of the shutter was further exposed from the state of (5); and (7) the yttrium oxide $Y_2O_3$ surface of the deposition shield upper portion was further exposed from the state of (6) (i.e., the same state as the state of (1)). In this manner, the causes of generation of yttrium Y were examined.

Figure 8:
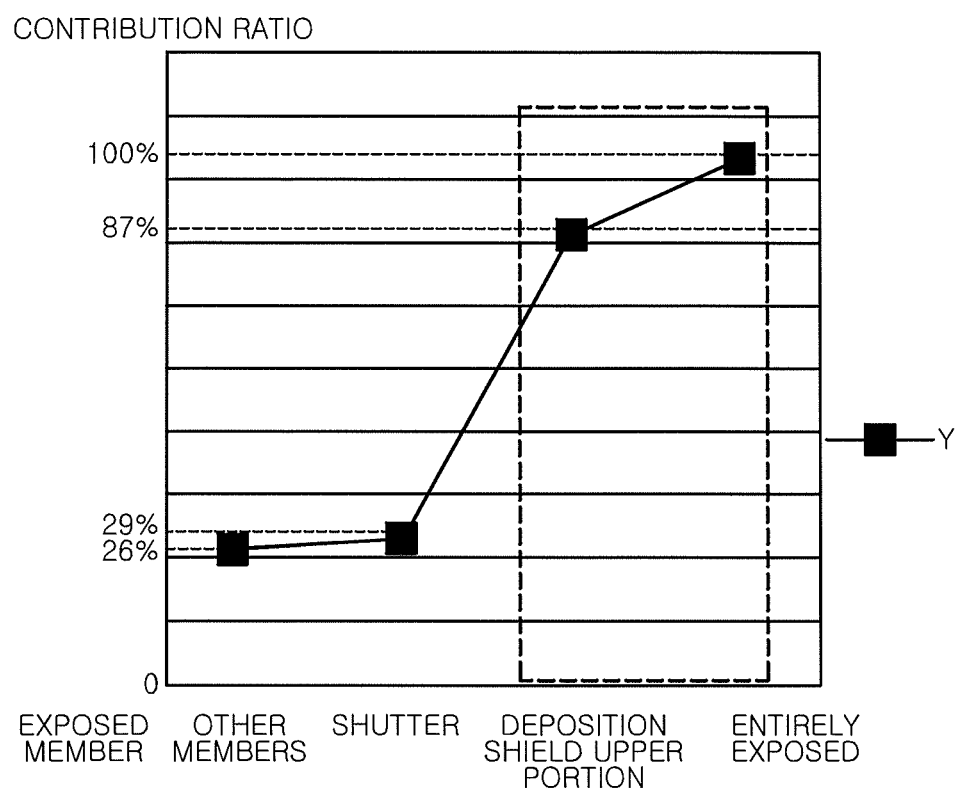
FIG. 8 shows a test result of FIG. 7.

FIG. 8 shows the EDX analysis result obtained in the case of exposing the yttrium oxide $Y_2O_3$ surfaces of the plasma-resistant members in the order from (1) to (7). The ratio of particles containing yttrium Y with respect to the total particles is expressed as a contribution ratio. When the exposure to the fluorine-based plasma was carried out in a state where the yttrium oxide $Y_2O_3$ surfaces of the other members (here, the ring bottom shield, the baffle plate, and the deposition shield lower portion) were exposed to the fluorine-based, the ratio of particles containing yttrium Y with respect to the total particles was 26%. When the exposure to the fluorine-based plasma was carried out in the state of (6) in which the yttrium oxide $Y_2O_3$ surface of the shutter was further exposed from the state of (5), the ratio of particles containing yttrium Y with respect to the total particles was slightly increased to 29%. When the exposure to the fluorine-based plasma was carried out in a state of (7) in which the yttrium oxide $Y_2O_3$ surface of the deposition shield upper portion was exposed, the ratio of particles containing yttrium Y with respect to the total particles was sharply increased to 87%.

The above result shows that, in the plasma processing apparatus having the configuration shown in FIG. 1, when the high frequency power for generating plasma of 60 MHz was applied to the upper electrode and a gap A (distance from the electrode plate 15 of the upper electrode to the top surface of the electrostatic chuck 22) was greater than that in a plasma processing apparatus shown in FIG. 10A to be described later, the particles were mainly generated from the deposition shield upper portion. As a result, it has been found that the deposition shield upper portion was sputtered by the plasma and the yttrium Y generated therefrom caused a contamination.

Therefore, in the respective embodiments of the present invention, among the inner surfaces of the processing chamber which are exposed to the plasma, at least a part of or all of the surfaces between a mounting position of the wafer W and an electrode to which the high frequency power for generating plasma is applied; or at least a part of or all of the surfaces of a facing electrode opposite to the electrode for the plasma generation need to be coated with a fluorinated compound. Particularly in the plasma processing apparatus having the configuration of FIG. 1, at least the deposition shield upper portion needs to be coated with a fluorinated compound. Hence, the generation of particles containing yttrium Y can be substantially prevented.

(Film Surface and Porosity)

The present inventors have observed surfaces and cross sections of the thermal-sprayed films of yttrium oxide $Y_2O_3$ and yttrium fluoride $YF_3$ by using an SEM (scanning electron microscope). As a result, it has been found that both thermal-sprayed films have the same surface state. The porosity of yttrium oxide $Y_2O_3$ was 3.3%, and that of yttrium fluoride $YF_3$ was 2.1%. Therefore, the density of the thermal-sprayed film of yttrium fluoride $YF_3$ was slightly higher. From the above, it has been proved that the thermal-sprayed film of yttrium fluoride $YF_3$ has an identical or a higher film quality than that of yttrium oxide $Y_2O_3$.

(Adhesion Strength of Thermal-Sprayed Film of $YF_3$)

Figures 9A, 9B:
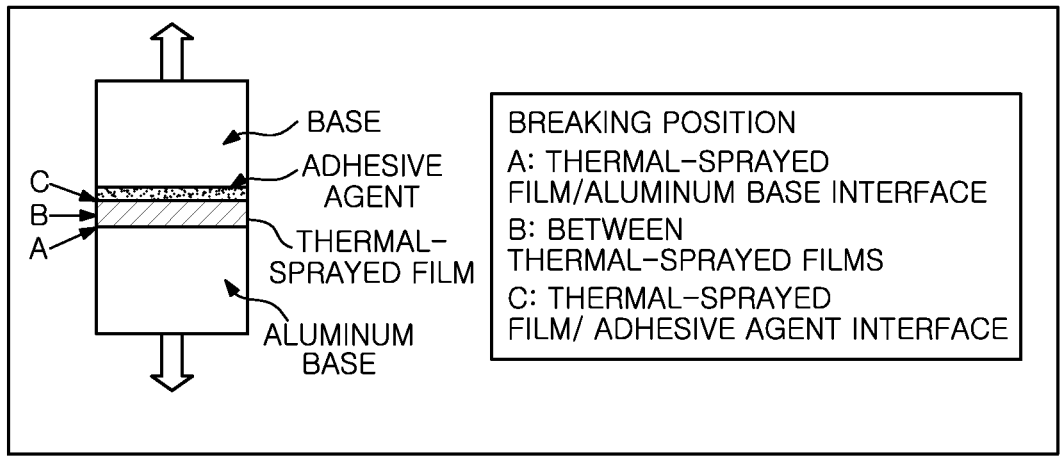
FIGS. 9A and 9B show a test result for examining adhesion strength of thermal-sprayed film of $YF_3$ and a test method thereof.

The present inventors have performed a tension test in order to examine adhesion strength of the thermal-sprayed film of yttrium fluoride $YF_3$. FIG. 9B shows a structure of a test sample used in the tension test, and FIG. 9A shows the test result of the adhesion strength of the thermal-sprayed film of yttrium fluoride $YF_3$.

As shown in FIG. 9B, the test sample has a structure in which a surface of an aluminum base is covered by a thermal-sprayed film of yttrium oxide $Y_2O_3$ or yttrium fluoride $YF_3$ and an adhesive agent is adhered thereon such that a base on the adhesive agent is adhered to the thermal-sprayed film. In that state, the test sample was pulled vertically, and it was examined whether or not a breaking occurred in a position A at an interface between the thermal-sprayed film and the aluminum base, a position B between the thermal-sprayed film layers, and a position C on an interface between the thermal-sprayed film and the adhesive agent.

As a result, in all the five tests, the breaking occurred in the position A. Further, the average of the breaking stress was 9.1 MPa in the case of the thermal-sprayed film of yttrium oxide $Y_2O_3$ and 10.8 MPa in the case of the thermal-sprayed film of yttrium fluoride $YF_3$, as shown in FIG. 9A. From the average of the breaking stress, it has been found that both films have the same strength.

As described above, in accordance with the present embodiment, at least a part of or all of the surfaces located between the upper electrode 12 and the mounting position of the wafer among the inner surfaces of the processing chamber 12 which are exposed to the plasma are coated with a fluorinated compound in plasma processing apparatus 10, which includes the processing chamber 12, the mounting table 20 for mounting thereon a wafer W in the processing chamber 12, the gas supply source 32 for introducing a gas including a halogen-containing gas and an oxygen gas into the processing chamber 12, the high frequency power source 18 for applying a high frequency power for generating plasma to the upper electrode 16 in the processing chamber 12, and the unit for generating a plasma of the gas including the halogen-containing gas and the oxygen gas by the high frequency power for generating plasma and processing the wafer W on the mounting table 20 by the action of the plasma, as shown in FIG. 1.

In the plasma processing apparatus 10 of the present embodiment, among the inner surfaces of the processing chamber which are exposed to the plasma, at least one of the inner surfaces located between the upper electrode 16 and the mounting position of the wafer W is coated with a fluorinated compound. Further, it has been found from the result shown in FIG. 8 that it is preferable to coat the deposition shield upper portion 38U with a fluorinated compound. Instead of the deposition shield upper portion 38U, the surface of at least one of the deposition shield lower portion 38L, the shutter 40, the baffle plate 36 or the ring bottom shield 42 which is exposed to the plasma, may be coated with a fluorinated compound. The top surface of the insulating ring 26, which is provided to surround the peripheral portion of the wafer W mounted on the mounting table 20, may be coated with a fluorinated film. Moreover, other chamber wall surfaces may be coated with a fluorinated compound.

When the inner surfaces of the processing chamber which are exposed to the plasma are coated with yttrium fluoride $YF_3$ or yttrium oxide $Y_2O_3$, the outermost layer is transformed into a Y—O—F layer by the plasma of the gas including the halogen-containing gas (here, the fluorine gas) and the oxygen gas. At this time, in the case of using the thermal-sprayed film of yttrium oxide $Y_2O_3$, the Y—O—F layer formed on the outermost surface is expanded in volume due to its lower density compared to yttrium oxide $Y_2O_3$ formed therebelow. As a consequence, the surface of the Y—O—F is distorted and a friction develops between the cracks, thereby generating particles containing Y—O—F, as described above. By repeating oxidation and fluorination in this state, particles containing yttrium Y are generated.

In accordance with the plasma processing apparatus 10 of the present embodiment, the inner surfaces of the processing chamber which are exposed to the plasma, are coated with the thermal-sprayed film of yttrium fluoride $YF_3$. The outermost layer of the yttrium fluoride $YF_3$ is transformed into a Y—O—F layer by the plasma of the gas including the halogen-containing gas (here, the fluorine gas) and the oxygen gas. The Y—O—F layer formed on the outermost surface is not expanded in volume due to its higher density compared to yttrium fluoride $YF_3$ formed therebelow. Therefore, no friction develops between the cracks on the surface of the yttrium fluoride $YF_3$. Further, the binding energy of Y—F is higher than that of Y—O, so that the surface of yttrium fluoride $YF_3$ is not easily oxidized. From the above reasons, the surface of yttrium fluoride $YF_3$ is stabilized, and the number of particles generated on the wafer can be extremely reduced to 0, 1 or 2, as shown in the graph of FIG. 2.

Further, in the case where the yttrium fluoride $YF_3$ is transformed into the Y—O—F layer by the plasma of the gas including the halogen-containing gas (here, the fluorine gas) and the oxygen gas, the Y—O—F layer has a thickness of 20 nm or less. Therefore, even if particles are generated from the transformed Y—O—F layer, the particles may have a size less than 20 nm. The particles having a size less than 20 nm do not cause the so-called killer defects which cause the line having a line width of 20 nm to be short-circuited in the recent fine processing. Hence, in accordance with the plasma processing apparatus 10 of the present embodiment, the number of fine particles can be reduced to almost zero during the plasma processing in which a gas including a halogen-containing gas (here, a fluorine gas) and an oxygen gas is introduced.

Second Embodiment

<Schematic Configuration of Plasma Processing Apparatus>

Next, a schematic configuration of a plasma processing apparatus 50 in accordance with a second embodiment of the present invention will be described with reference to FIG. 10A. FIG. 10A is a vertical cross sectional view showing a schematic configuration of the plasma processing apparatus 50 of the second embodiment. The plasma processing apparatus 50 of the second embodiment is configured as a magnetron RIE plasma processing apparatus, and includes a cylindrical processing chamber 52 made of metal, e.g., aluminum, stainless steel or the like. The processing chamber 52 is grounded.

In the processing chamber 52, the mounting table 60 for mounting thereon the wafer W is provided. The mounting table 60 is made of, e.g., aluminum, and supported in the processing chamber 52 via an insulating support member (not shown). Provided on a top surface of the mounting table 60 is an electrostatic chuck 62 for holding the wafer W by an electrostatic adsorptive force. The wafer W is electrostatically adsorbed on the electrostatic chuck 62 by a Coulomb force generated with a DC voltage applied from a DC power supply 64 to an electrode plate 62*a* in the electrostatic chuck 62. The wafer W is mounted on the electrostatic chuck 62. A thermal-sprayed film 67 of yttrium fluoride $YF_3$ is formed on at least a side surface of the electrostatic chuck 62, because the side surface of the electrostatic chuck 62 is exposed to the plasma. The thermal-sprayed film 67 of yttrium fluoride $YF_3$ may be formed on a top surface as well as the side surface or the entire surface of the electrostatic chuck 62. Particularly, the top surface of the electrostatic chuck 62 is exposed to the plasma during the waferless dry cleaning WLDC. Thus, by forming the thermal-sprayed film 67 of yttrium fluoride $YF_3$ on the top surface of the electrostatic chuck 62, the generation of particles containing yttrium Y can be suppressed.

A high frequency power source 68 is connected to the mounting table 60 via a matching unit (not shown). The high frequency power source 68 applies a high frequency power of, e.g., 13.56 MHz for generating plasma, to the mounting table 60. In this manner, the mounting table 60 also serves as a lower electrode. A gas including a halogen-containing gas and an oxygen gas is supplied into the processing chamber 12 by a gas supply source (not shown).

A gas exhaust path 74 is formed between a sidewall of the processing chamber 52 and a sidewall of the mounting table 60. A baffle plate 76 for gas flow control is provided at an upper portion of the gas exhaust path 74. The baffle plate 76 is located substantially at the same level as that of the wafer or the electrostatic chuck 62. The gas exhaust path 74 is connected to a gas exhaust unit (not shown), and a pressure in a processing space in the processing chamber 52 is decreased to a predetermined vacuum level by using a vacuum pump.

Attached to the sidewall of the processing chamber 52 are a deposition shield 78 and a shutter 80 for opening and closing a loading/unloading opening of the wafer W. A ring bottom shield 82 is attached to the sidewall of the mounting table 60. The surfaces of the baffle plate 76, the deposition shield 78, the shutter 80 and the ceiling surface 84 (the upper electrode), which are made of, e.g., aluminum and exposed to the plasma, are coated with thermal-sprayed films 90 of yttrium fluoride $YF_3$.

An upper and a lower magnet 92 extending in a ring shape or a coaxial shape are provided to surround the processing chamber 52, so that the plasma is controlled by magnetic force. In the processing chamber 52, a vertical RF electric field is formed in a plasma generation space between the ceiling surface 84 and the mounting table 60 by the high frequency power source 68. A high-density plasma is generated near the surface of the electrostatic chuck 62 by the high frequency discharge. Due to the action of the plasma thus generated, the wafer W is etched in the processing chamber 52.

(Schematic Configuration/Modification of Plasma Processing Apparatus)

Figure 10A:
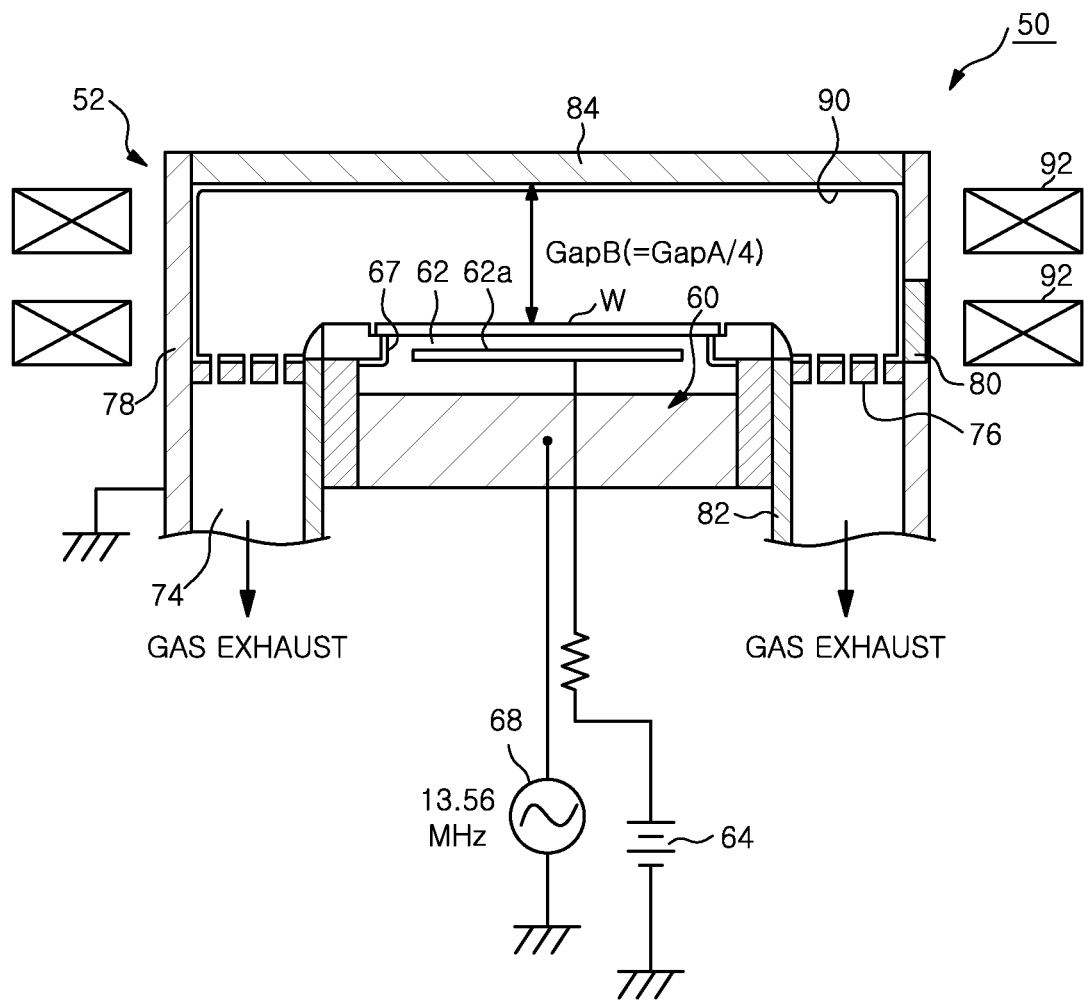
FIG. 10A shows a schematic configuration of a plasma processing apparatus in accordance with a second embodiment of the present invention.
Figure 10B:
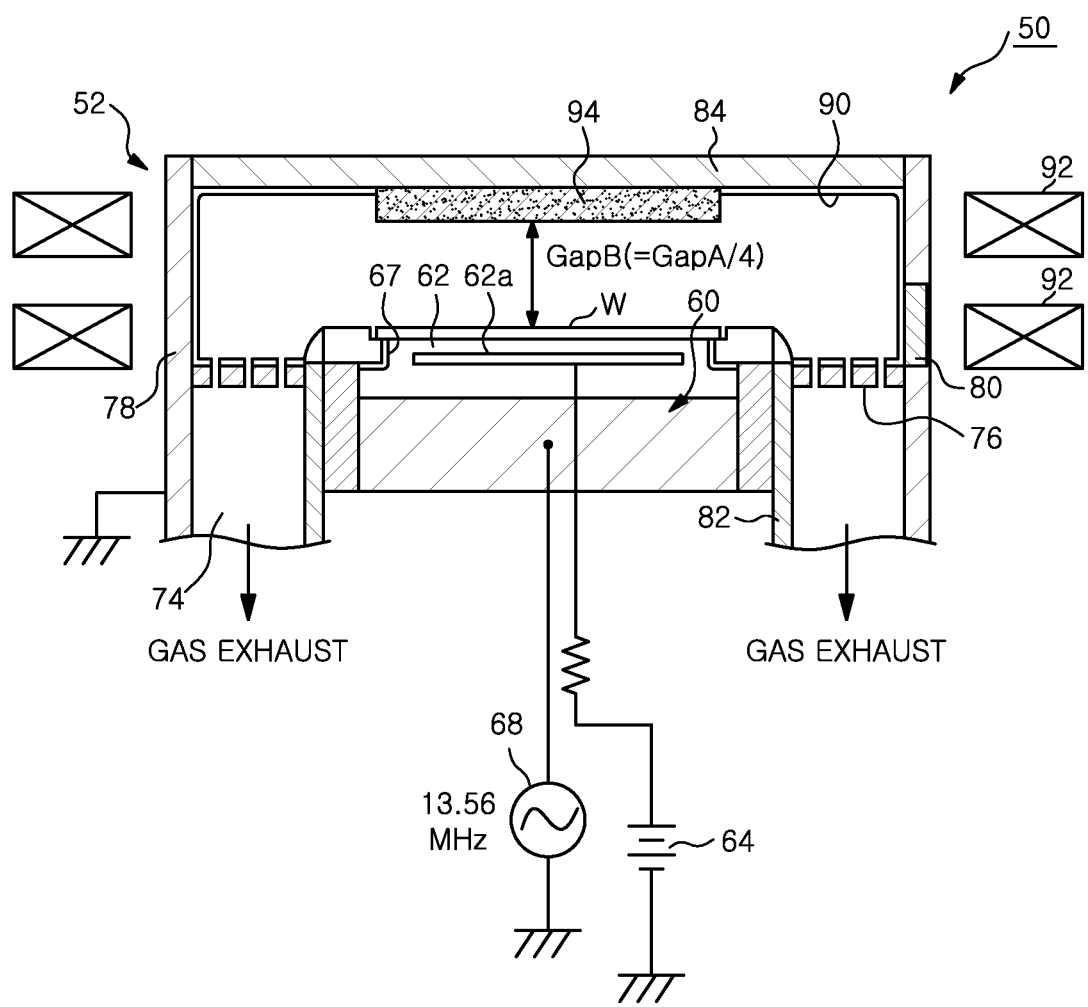
FIG. 10B shows a schematic configuration of a plasma processing apparatus in accordance with a modification of the second embodiment.

The plasma processing apparatus 50 shown in FIG. 10B is different from the plasma processing apparatus 50 shown in FIG. 10A in that a circular plate-shaped member 94 made of silicon is formed on a bottom surface of the ceiling surface 84 (upper electrode) so as to face the wafer W. The thermal-sprayed film of yttrium fluoride $YF_3$ is not formed on the circular plate-shaped member 94.

In this case, the generation of particles containing yttrium Y can be reliably reduced by forming the thermal-sprayed film of yttrium fluoride $YF_3$ on the inner surfaces around the circular plate-shaped member 94, which are exposed to the plasma. Further, when the upper electrode is made of silicon, the contamination level is decreased by two order of magnitude (E+10 atm/cm$^2$) compared to when the upper electrode is made of quartz. Even in this case, yttrium Y may be attached to the wafer. In that case, it is effective to form the thermal-sprayed film of yttrium fluoride $YF_3$ on the deposition shield.

In any of the plasma processing apparatuses 50 shown in FIGS. 10A and 10B, the gap B between the ceiling surface 84 and the mounting table 60, and the gap B between the circular plate-shaped member 94 and the mounting table 60 are small and each corresponds to about ¼ of the gap A in the plasma processing apparatus 10 shown in FIG. 1. In the plasma processing apparatus 10 shown in FIG. 1 in which the gap is large, the ground surface, when viewed from the plasma, with respect to the upper electrode to which the high frequency power for generating plasma is applied is mainly the side surface of the plasma generation space, i.e., the deposition shield upper portion, above the wafer W. Thus, as can be seen from the test result of FIG. 8, the particles containing yttrium Y were mainly generated from the deposition shield upper portion.

However, in the plasma processing apparatus 50 in which the gap is small, the lower electrode and the upper electrode are close to each other, so that the yttrium Y is generated mainly from the upper electrode that is the electrode opposite to the lower electrode (the mounting table 60) to which the high frequency power for generating plasma is applied, as compared with the plasma processing apparatus 10 of FIG. 1 in which the gap is large.

<Examination of Particle Generation>

(the Number of Particles)

Based on the above prediction, the number of particles being generated was observed by using the plasma processing apparatus 50 of the second embodiment. Here, as the sequence of the plasma processing shown in FIG. 11A, first, the maintenance of the chamber, which includes a wet cleaning in the processing chamber or the like, was performed and then, twenty-five dummy wafers were subjected to plasma processing while setting an atmosphere in the processing chamber (seasoning). Next, a non-plasma particle cleaning (NPPC) was performed. The recipe for the dummy wafers had a single step, and $CHF_3/CH_4/Ar/O_2$ gases were supplied as a processing gas for the dummy wafers. In the dry cleaning (DC), $O_2$ gas was supplied. Accordingly, the surface of the processing chamber 52 which was exposed to the plasma, was repetitively subjected to a cycle of fluorination and oxidation.

Figure 11A:
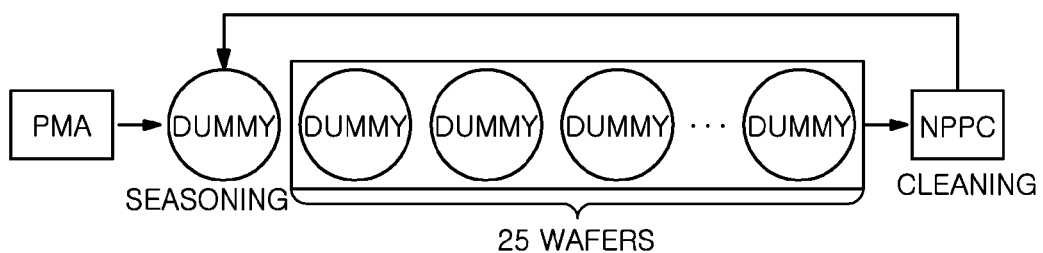
FIG. 11A is an explanatory view showing a sequence of a plasma processing in the second embodiment.
Figure 11B:
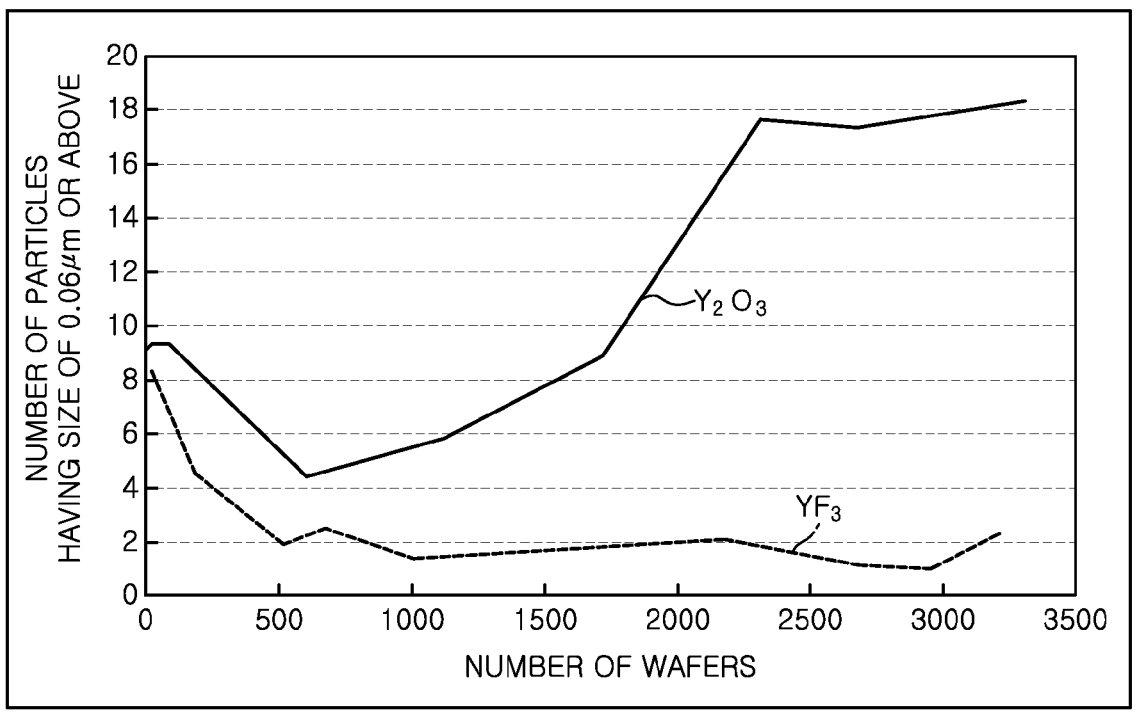
FIG. 11B is a graph comparing a relationship between the number of particles (about 0.06 μM or above) and the number of processed wafers in the plasma processing apparatus with that in a comparative example.

The result of repetition of the above-described plasma processing is shown in a graph of FIG. 11B. A horizontal axis and a vertical axis in the graph represent the number of wafers and the number of particles having a size of 0.06 μm or above, respectively.

According to this result, in the case of forming the thermal-sprayed film of yttrium oxide $Y_2O_3$, the number of particles having a size of 0.06 μm or above was rapidly increased after $1500^{th}$ wafer was processed as in the first embodiment. However, in the case of forming the thermal-sprayed film of yttrium fluoride $YF_3$, the rapid increase in the number of particles having a size of 0.06 μm or above was not observed unlike the case of yttrium oxide $Y_2O_3$ and the number of particles stably maintained at 1 or 2 even after $2000^{th}$ wafer was processed.

This result shows that the particle level in the thermal-sprayed film of yttrium fluoride $YF_3$ was stabilized at a low level compared to that in the thermal-sprayed film of yttrium oxide $Y_2O_3$. Particularly, it was proved that the number of particles was rapidly increased after the $1500^{th}$ wafer was processed in the case of using yttrium oxide $Y_2O_3$, whereas the number of particles was stabilized at a low level even after the $1500^{th}$ wafer was processed in the case of using yttrium fluoride $YF_3$.

Figure 12A:
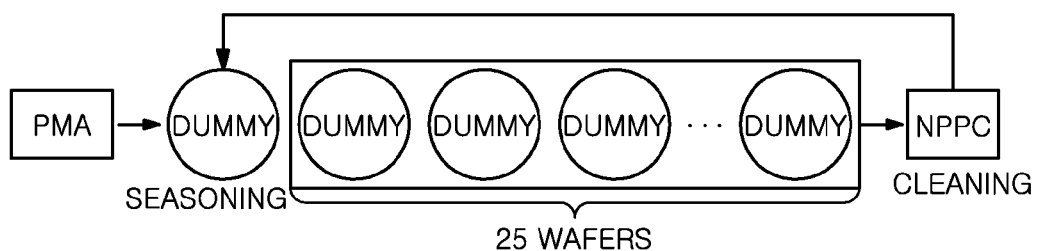
FIG. 12A is an explanatory view showing a sequence of the plasma processing in the second embodiment.
Figure 12B:
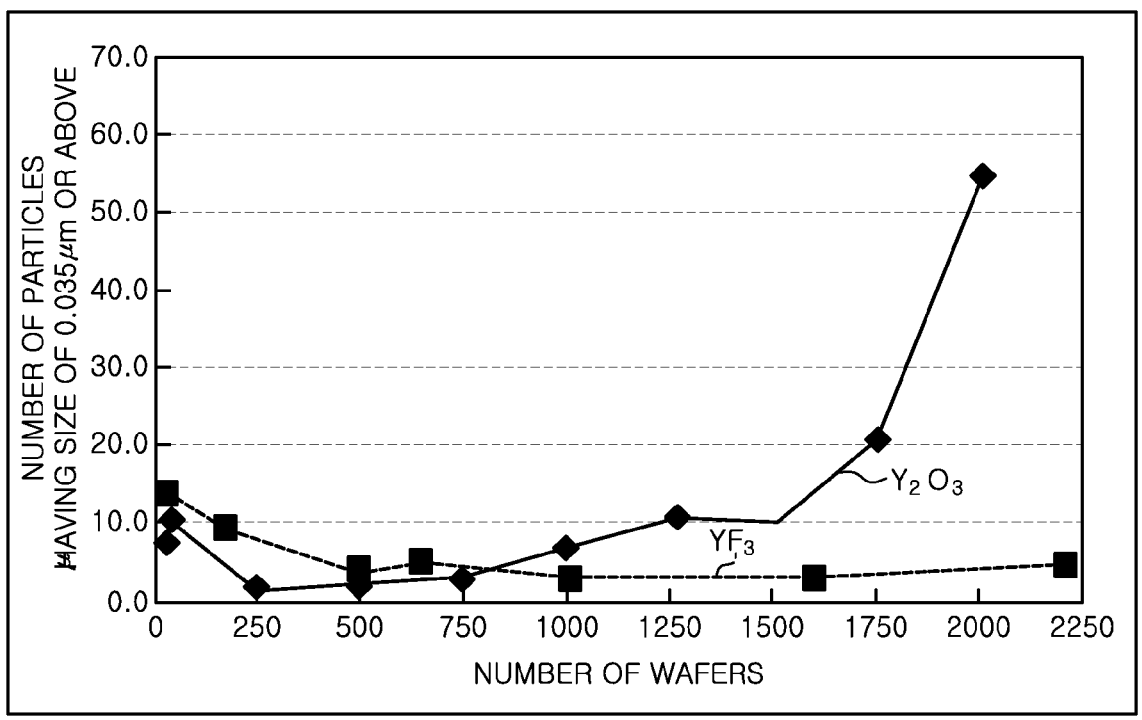
FIG. 12B is a graph comparing a relationship between the number of particles (about 0.035 μm or above) and the number of processed wafers in the plasma processing apparatus with that in a comparative example.

While the graph of FIG. 11B shows the test result of particles having a size of 0.06 μm or above, the graph of FIG. 12B shows the test result of particles having a size of 0.035 μm or above. A horizontal axis and a vertical axis in the graph of FIG. 12B indicate the number of wafers and the number of particles having a size of 0.035 μm or above, respectively. The graph of FIG. 12B shows the result of the processing wafers in the sequence of the plasma processing described in FIG. 12A. The plasma processing sequence shown in FIG. 12A is the same as that shown in FIG. 11A, so that the description thereof will be omitted.

According to this result, in the case of forming the thermal-sprayed film of yttrium oxide $Y_2O_3$, the number of particles having a size of 0.035 μm or above as well as the particles having a size of about 0.06 μm or above was rapidly increased after the $1500^{th}$ wafer was processed. However, in the case of using the thermal-sprayed film of yttrium fluoride $YF_3$, the number of particles having a size of 0.035 μm was stabilized at about 1 to 3 without being sharply increased even after the $2000^{th}$ wafer was processed. This result shows that the particle level in the thermal-sprayed film of yttrium fluoride $YF_3$ was stabilized at a lower level compared to that in the thermal-sprayed film of yttrium oxide $Y_2O_3$.

(EDX and ICP-Mass Analysis)

Next, in the plasma processing apparatus 50 of the second embodiment, the case of using yttrium fluoride $YF_3$ to form a thermal-sprayed film and the case of using yttrium oxide $Y_2O_3$ to form a thermal-sprayed film were analyzed by using ICP-Mass and EDX. The result thereof is shown in FIG. 13.

From the ICP-Mass analysis result, as described in the first embodiment, it has been found that the analysis values were not greatly varied either in the case of using yttrium fluoride $YF_3$ to form a thermal-sprayed film or in the case of using yttrium oxide $Y_2O_3$ to form a thermal-sprayed film. Hence, it has been found that the number of particles on the entire wafer surface was not considerably changed even after the number of processed wafers was increased.

Meanwhile, the EDX analysis result shows that when yttrium oxide $Y_2O_3$ was used to form a thermal-sprayed film, the number of particles containing yttrium Y in the total number of particles (i.e. contribution of Y) was increased as the number of processed wafers was increased. On the other hand, when yttrium fluoride $YF_3$ was used to form a thermal-sprayed film, the number of particles containing yttrium Y was not increased even if the number of processed wafers was increased. If any, a single particle containing yttrium Y existed on a single wafer. Accordingly, it was proved that when yttrium fluoride $YF_3$ was used to form a thermal-sprayed film, the number of particles was small and the number of particles containing yttrium Y in the particles was considerably small.

Therefore, in the plasma processing apparatus 50 of the second embodiment as well as that of the first embodiment, when yttrium fluoride $YF_3$ was used to form a thermal-sprayed film, the particles containing yttrium Y in the total number of particles (i.e., contribution of Y) was not increased even as the number of processed wafers was increased, unlike when yttrium oxide $Y_2O_3$ was used to form a thermal-sprayed film. Further, the number of particles was small, and the number of particles containing yttrium Y on a single wafer was about 0, 1, or 2 even after 2000 wafers were processed.

(Detection of Causes of Generation of Yttrium Y)

Next, in the second embodiment, the present inventors have examined causes of generation of yttrium Y by exposing the thermal-sprayed films of yttrium oxide $Y_2O_3$, which were formed on the plasma-resistant members in the plasma processing apparatus 50 of the second embodiment, such as the deposition shield, the shutter, the baffle plate, and the upper electrode.

In other words, as shown in FIG. 14, the thermal-sprayed films of yttrium oxide $Y_2O_3$ were exposed in the following order: (1) the entire yttrium oxide $Y_2O_3$ surface was exposed; (2) the entire yttrium oxide $Y_2O_3$ surface was covered so as not to be exposed; (3) only the yttrium oxide $Y_2O_3$ surface of the shutter was exposed from the state of (2); (4) the yttrium oxide $Y_2O_3$ surface of the deposition shield was further exposed from the state of (3); (5) the yttrium oxide $Y_2O_3$ surface of the baffle plate was further exposed from the state of (4); and (6) the yttrium oxide $Y_2O_3$ surface of the upper electrode was further exposed from the state of (5) (i.e., the same state as the state (1)). In this manner, the generation causes of yttrium Y were examined.

Figure 15:
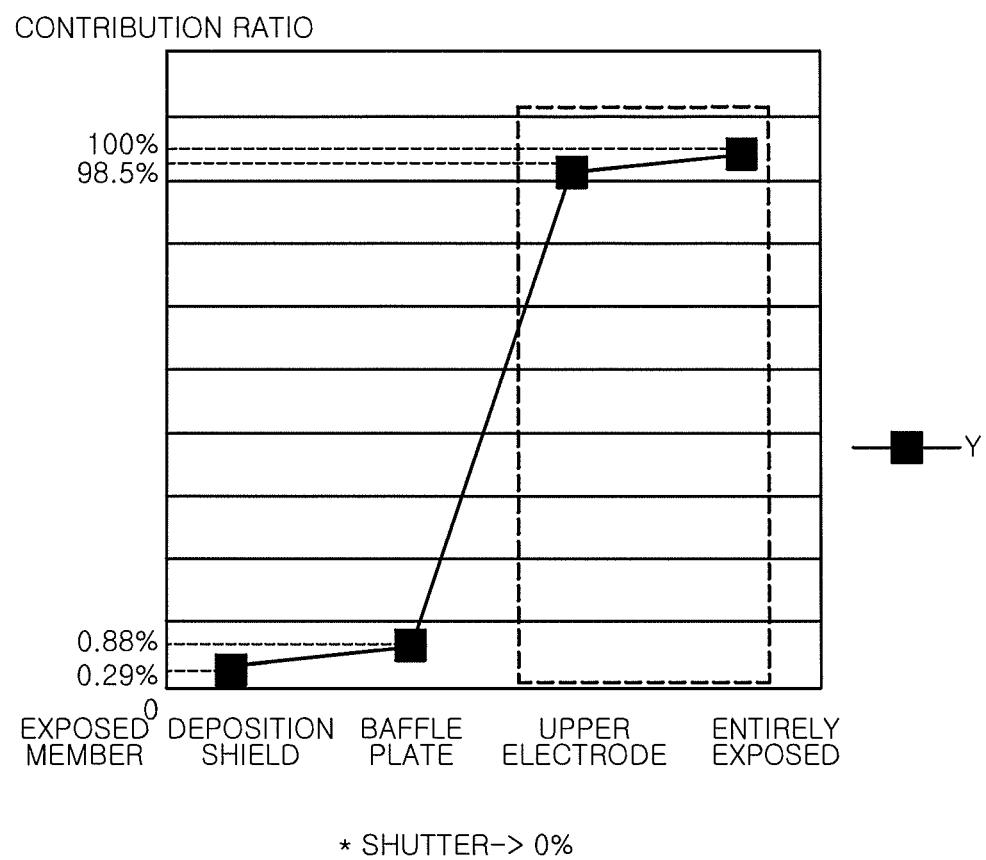
FIG. 15 shows a test result of FIG. 14.

FIG. 15 shows the EDX result obtained in the case of exposing the yttrium oxide $Y_2O_3$ surfaces of the plasma-resistant members in the order from (1) to (6) shown in FIG. 14. In this case, yttrium Y was not detected when the exposure to a fluorine-based plasma was carried out in a state of (3) in which the yttrium oxide $Y_2O_3$ surface of the shutter was exposed. When the exposure to a fluorine-based plasma was carried out in a state of (4) in which the yttrium oxide $Y_2O_3$ surface of the deposition shield was exposed, the ratio of particles containing yttrium Y with respect to the total number of particles was 0.29%, which was low. When the exposure to a fluorine-based plasma was carried out in a state of (5) in which the yttrium oxide $Y_2O_3$ surface of the baffle plate was exposed, the ratio of particles containing yttrium Y with respect to the total number of particles was 0.88%, which was still low. When the exposure to a fluorine-based plasma was carried out in a state of (6) in which the yttrium oxide $Y_2O_3$ surface of the upper electrode was exposed, the ratio of particles containing yttrium Y with respect to the total number of particles was sharply increased to 98.5%.

The above result shows that in the plasma processing apparatus having the configuration shown in FIG. 10A, when the high frequency power for generating plasma of 13.56 MHz is applied to the lower electrode and the gap B is smaller than that in the plasma processing apparatus (see FIG. 1) of the first embodiment, the particles are mainly generated from the upper electrode. In other words, the upper electrode serves as an electrode opposite to an electrode (the lower electrode in the present embodiment) to which the high frequency power for generating plasma is applied, and since the upper electrode is sputtered, most of the contamination of yttrium Y is caused by the upper electrode.

Therefore, in the respective embodiments of the present invention, among the inner surfaces of the processing chamber which are exposed to the plasma, at least a part of or all of the surfaces between the mounting position of the wafer W and an electrode to which the high frequency power for generating plasma is applied; or at least a part of or all of the surfaces of a facing electrode opposite to the electrode for the plasma generation need to be coated with a fluorinated compound. Particularly in the plasma processing apparatus having the configuration of FIG. 10A, at least the upper electrode needs to be coated with a fluorinated compound. Hence, the generation of particles containing yttrium Y can be substantially prevented.

As described above, in accordance with the present embodiment, at least a part of or all of the surfaces located between the mounting position of the wafer W and the upper electrodes 84 and 94 among the inner surfaces of the processing chamber 52 which are exposed to the plasma are coated with a fluorinated compound in plasma processing apparatus 50, which includes the processing chamber 52, the mounting table 60 for mounting thereon a wafer W in the processing chamber 52, the gas supply source for introducing a gas including a halogen-containing gas and an oxygen gas into the processing chamber 52, the high frequency power source 68 for applying a high frequency power for generating plasma to the lower electrode (mounting table 60) in the processing chamber 52, and the unit for generating a plasma of the gas including the halogen-containing gas and the oxygen gas by the high frequency power for generating plasma and processing the wafer W on the mounting table 60 by the action of the plasma, as shown in FIGS. 10A and 10B.

In the plasma processing apparatus 50 of the present embodiment, among the inner surfaces of the processing chamber which are exposed to the plasma, a part of or all of the surfaces located between the electrode and the baffle plate, or a part of or all of the surfaces located between a facing electrode opposite the above electrode and the baffle plate may be coated with a fluorinated compound. Further, it has been found from the result shown in FIGS. 14 and 15 that it is preferable to coat the upper electrodes 84 and 94 with a fluorinated compound. Instead of the upper electrodes 84 and 94, the surface of at least one of the deposition shield, the shutter, or the baffle plate which is exposed to the plasma may be coated with a fluorinated compound. Further, a side surface of the electrostatic chuck 62 or the side surface and a top surface thereof may be coated with a fluorinated film. Moreover, other chamber wall surfaces may be coated with a fluorinated compound.

The first and the second embodiment have described the case of forming thermal-sprayed films of yttrium fluoride $YF_3$ at the members in the processing chamber which are exposed to the plasma in the plasma processing apparatuses having gap sizes that are different from each other by a factor of four.

However, the configuration of the plasma processing apparatus is not limited to that shown in FIG. 1, 10A or 10B.

Therefore, inner surfaces of the processing chamber exposed to the plasma which will be coated with a fluorinated compound can be determined depending on the gap size from the mounting table to the ceiling surface of the processing chamber.

(Variation 1)

Figure 16A:
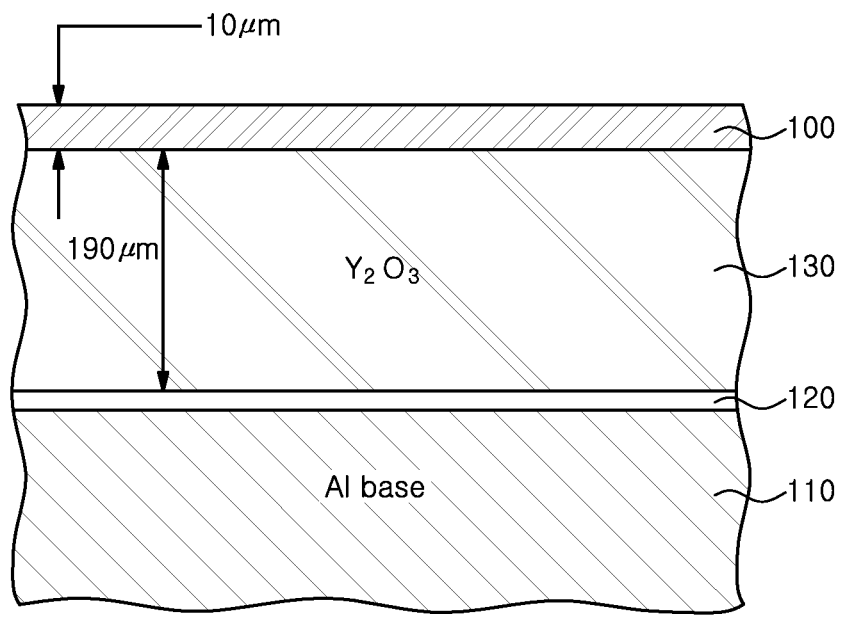
FIGS. 16A to 16C show examples of thermal-sprayed films in the first and the second embodiment.
Figure 16B:
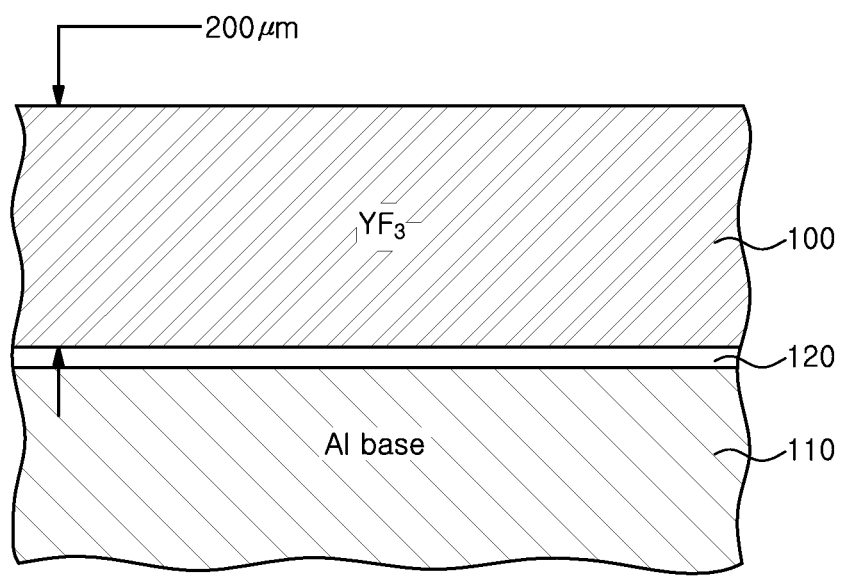
Figure 16C:
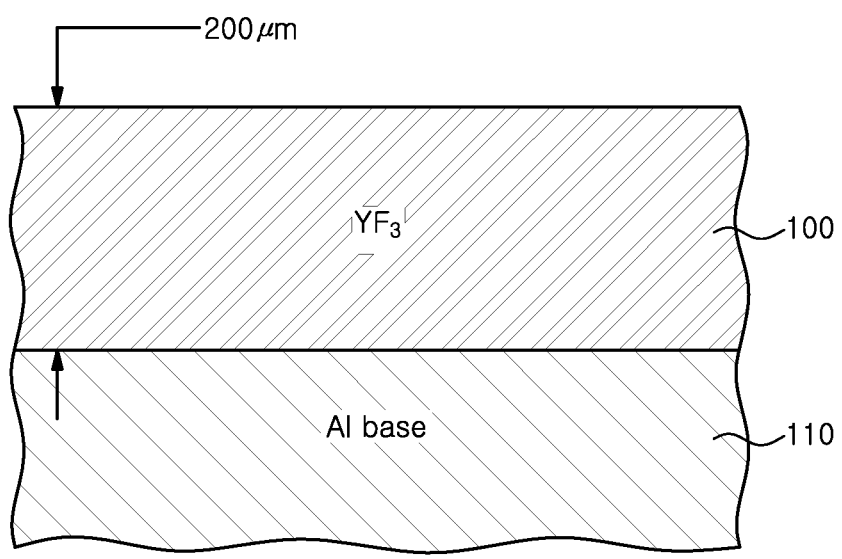

Next, examples of the thermal-sprayed film of yttrium fluoride $YF_3$ in the first and the second embodiment will be described with reference to FIGS. 16A to 16C. As shown in FIGS. 16A to 16C, various examples of forming the thermal-sprayed film of yttrium fluoride $YF_3$ are described. As an example, in FIG. 16A, an anodically oxidized alumina $Al_2O_3$ 120 is directly coated on an Al base 110 forming a chamber wall or the like of the processing chamber; and a thermal-sprayed film of yttrium oxide $Y_2O_3$ 130 is formed thereon; and, then, a thermal-sprayed film of yttrium fluoride $YF_3$ 100 is formed on the outermost layer. Here, the yttrium oxide $Y_2O_3$ 130 has a thickness of 190 μm, and the yttrium fluoride $YF_3$ 100 has a thickness of 10 μm. When the thermal-sprayed films are made of the yttrium oxide $Y_2O_3$ 130 and the yttrium fluoride $YF_3$ 100, the thickness of the yttrium fluoride $YF_3$ 100 with respect to the total thickness of 200 μm is less than 200 μm. More preferably, the yttrium fluoride $YF_3$ 100 may have a thickness ranging from 100 nm to 50 μm and the yttrium oxide $Y_2O_3$ 130 may have the remaining thickness out of the total thickness of 200 μm.

Further, as another example, in FIG. 16B, the anodically oxidized alumina $Al_2O_3$ 120 is directly coated on the Al base 110 forming the chamber wall or the like of the processing chamber and then, the thermal-sprayed film of yttrium fluoride $YF_3$ 100 is formed thereon. Here, the yttrium fluoride $YF_3$ 100 has a thickness of 200 μm.

Further, as still another example, in FIG. 16C, the thermal-sprayed film of the yttrium fluoride $YF_3$ 100 may be directly formed on the Al base 110. Here, the yttrium fluoride $YF_3$ 100 has a thickness of 200 μm.

As described above, the yttrium fluoride $YF_3$ 100 may be formed on the metal base directly or on the outermost layer through one or more insulating films. Further, the yttrium fluoride $YF_3$ 100 may be formed on the Al base directly or on the base of the alumina $Al_2O_3$ film or the yttrium oxide $Y_2O_3$ film to obtain the withstand voltage of the component.

By forming the yttrium fluoride $YF_3$ 100 on the outermost layer, the generation of particles containing yttrium Y can be suppressed. Particularly, since the thermal-sprayed film has a two-layer structure of the yttrium oxide $Y_2O_3$ 130 and the yttrium fluoride $YF_3$ 100 as shown in FIG. 16B, the cost and the withstand voltage suitable for conventional products can be obtained, thus making the installation easy.

(Variation 2)

In the above embodiments, yttrium fluoride $YF_3$ has been described as an example of a fluorinated compound. However, another fluorinated compound may also be used in the plasma processing apparatus of each of the above embodiments. For example, the material forming the fluorinated compound may include a rare earth element, or an alkaline earth element containing Ca or Mg.

As for the thermal spraying material, a rare metal fluorinated compound with plasma resistance may be used other than yttrium fluoride $YF_3$. The material forming the fluorinated compound may contain any one of Y, Ce, Eu, Sm, Yb, Dy, Gd, Ca, and Mg. For example, referring to the data of FIG. 6, rare earth fluorides $YF_3$, $CeF_3$, $SmF_3$, $EuF_3$, $GdF_3$, $DyF_3$, $ErF_3$ and $YbF_3$ have lower densities compared to rare earth oxides $Y_2O_3$, $Ce_2O_3$, $Sm_2O_3$, $Eu_2O_3$, $Gd_2O_3$, $Dy_2O_3$, $Er_2O_3$ and $Yb_2O_3$. In other words, the thermal-sprayed films made of those compounds are not expanded in volume. Hence, as can be seen from the principle of particle generation, no friction develops between the cracks in the case of the thermal-sprayed films made of those compounds, and the generation of particles can be effectively suppressed. For example, a fluorinated compound containing Ce, Sm and Yb may be used instead of Y. Specifically, it is preferable to use $SmF_3$, $GdF_3$, $DyF_3$, $YbF_3$ or the like that is not expanded in volume and has an equal or higher plasma resistance than that of yttrium oxide $Y_2O_3$.

FIG. 17 shows an evaluation of the plasma-resistance of each of the rare metal thermal-sprayed films. Here, $CF_4/Ar/O_2$ gases were supplied, and the plasma processing was performed for 10 hours under the conditions that the inside of the processing chamber had been cleaned without deposits. Then, the step height was measured by a laser displacement sensor. FIG. 17 shows the amount of abrasion (etching rate) per hour. Particularly, referring to the abrasion amount of the materials which is an indicator of the plasma resistance in FIG. 17, $Dy_2O_3$ and $Yb_2O_3$ have high abrasion resistance and high plasma resistance. Therefore, it is preferable to use fluorinated compounds of $Dy_2O_3$ and $Yb_2O_3$, i.e., $DyF_3$ and $YbF_3$ to thereby suppress the generation of particles containing yttrium Y and to make it difficult to be consumed by the plasma attack. $GdF_3$ and $SmF_3$ have substantially the same abrasion amount as that of $Y_2O_3$ and thus, the plasma-resistance thereof is practically applicable. Accordingly, $GdF_3$ and $SmF_3$ may be used, instead of yttrium fluoride $YF_3$, in the plasma processing apparatus.

Figure 18:
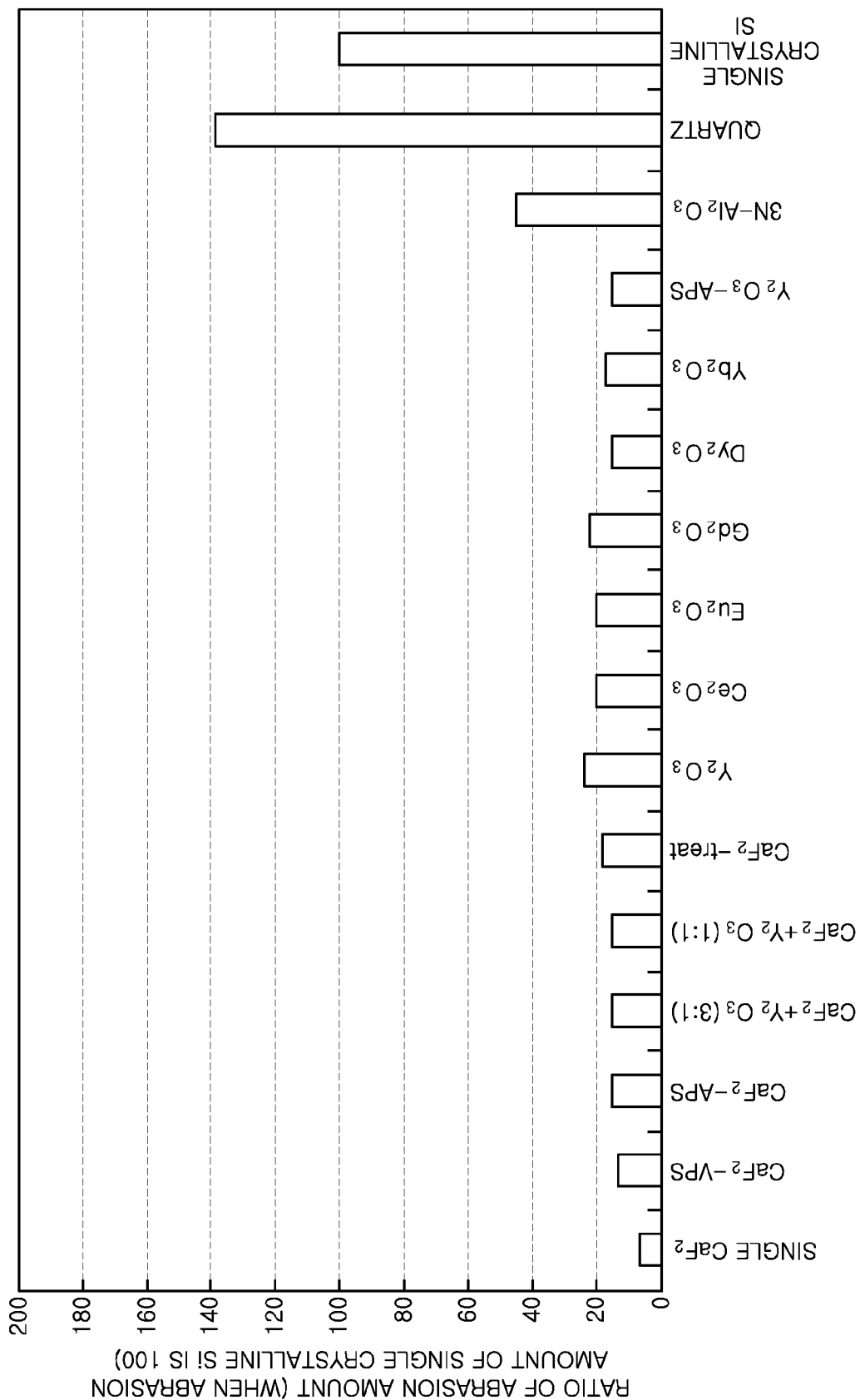
FIG. 18 shows the ratio of the abrasion amount of each material.

The histogram of FIG. 18 shows the ratio of the abrasion amount of materials relative to single crystalline silicon Si on the assumption that the abrasion amount of single crystalline silicon Si is 100. Referring thereto, $Ce_2O_3$, $Eu_2O_3$, $Gd_2O_3$ and $Dy_2O_3$ have substantially the same or smaller abrasion amount as that of yttrium oxide $Yb_2O_3$. Therefore, $Ce_2O_3$, $Eu_2O_3$, $Gd_2O_3$, and $Dy_2O_3$ can be used, instead of yttrium fluoride $YF_3$, in the plasma processing apparatus. Moreover, a fluorinated compound $CaF_2$ of Ca as an alkaline earth element has a smaller abrasion amount relative to single crystalline silicon Si and thus is considered as a material having a high plasma resistance. Further, $CaF_2$ is suitable for suppressing the generation of particles containing yttrium Y. $MgF_2$ may provide the same effect.

Therefore, the material of the fluorinated compound may be $YF_3$ or a fluorinated compound that does not contain Y. If the material of the fluorinated compound does not contain Y, the particles containing yttrium Y are not generated.

Further, the material of the fluorinated compound may be fluorinated compounds of Al and Si.

(Test of Thermal-Sprayed Film of $YF_3$)

Figure 20A:
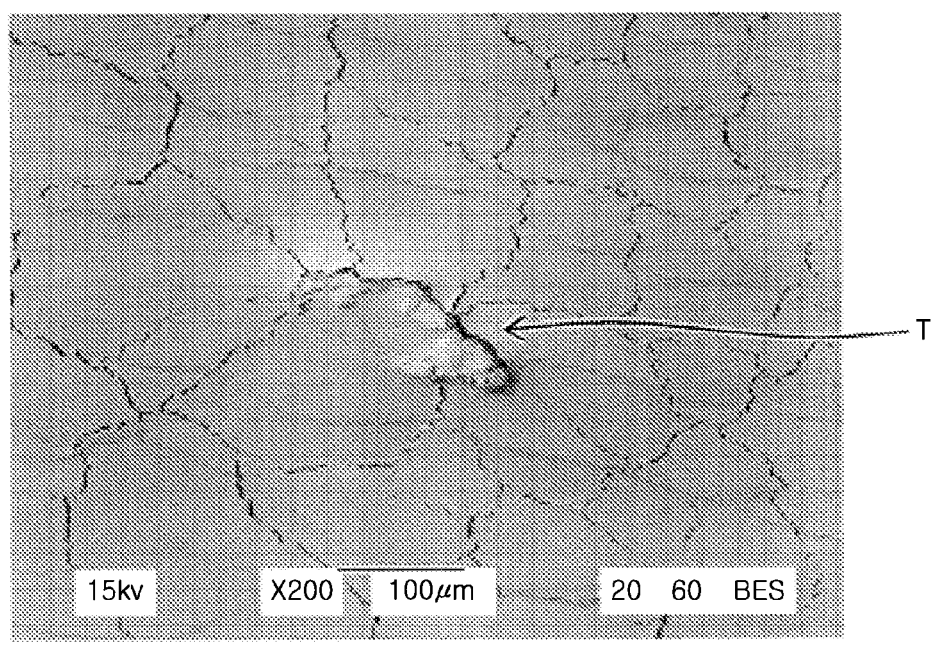
FIGS. 20A and 20B show surface SEM images of the thermal-sprayed films of $YF_3$ having different surface roughnesses after recrystallization in one embodiment of the present invention.
Figure 20B:
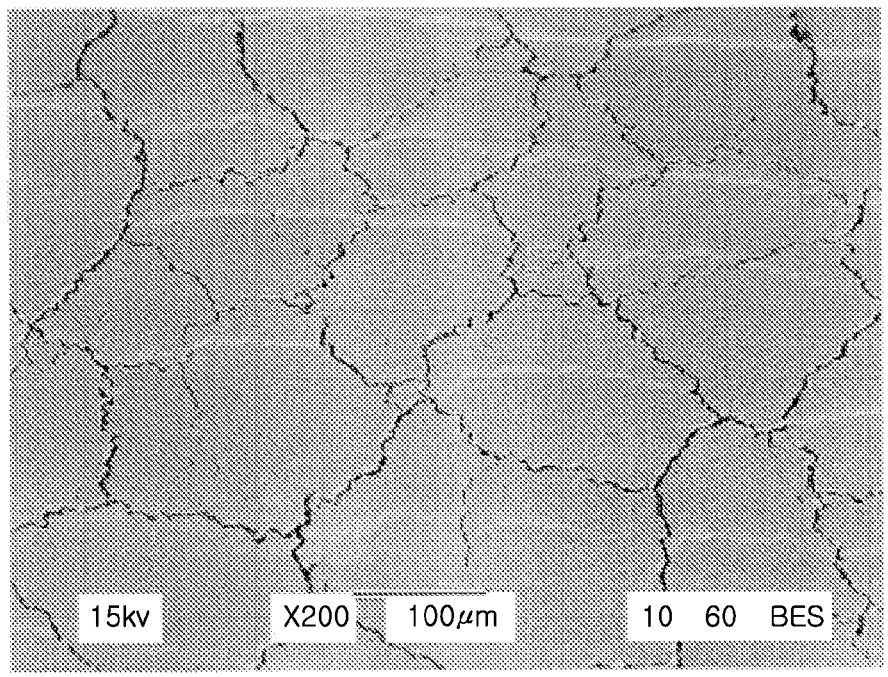

Various tests on the thermal-sprayed films of $YF_3$ in the above respective embodiments were carried out. First, the surface roughness R of the thermal-sprayed film of $YF_3$ was tested. FIGS. 20A and 20B show examples of surface SEM images of the thermal-sprayed films of $YF_3$ having different surface roughnesses after being melted by using energy rays such as electron beams or the like and recrystallizing the melted films in one embodiment of the present invention. FIG. 20A shows the surface SEM image of the thermal-sprayed films of $YF_3$ having a surface roughness Ra of 10.2. FIG. 20B shows the surface SEM image of the thermal-sprayed films of $YF_3$ having a surface roughness Ra of 5.4. In the case of the surface roughness Ra of 10.2 shown in FIG. 20A, a non-densified defective portion T was generated on the recrystallized surface of the thermal-sprayed film of $YF_3$. On the other hand, in the case of the surface roughness Ra of 5.4 shown in FIG. 20B, the recrystallized surface of the thermal-sprayed film of $YF_3$ was densified and smooth.

The above test results show that when the surface of the thermal-sprayed film of $YF_3$ is rough, the melting and the recrystallization of $YF_3$ are not uniformly performed and thus, a non-densified portion may be generated. Therefore, the surface layer of the thermal-sprayed film of $YF_3$ before being melted needs to be densified to a certain level. It has been found based on the results shown in FIGS. 20A and 20B that the surface roughness Ra of the thermal-sprayed film of $YF_3$ is preferably 7.0 or less.

Figure 21A:
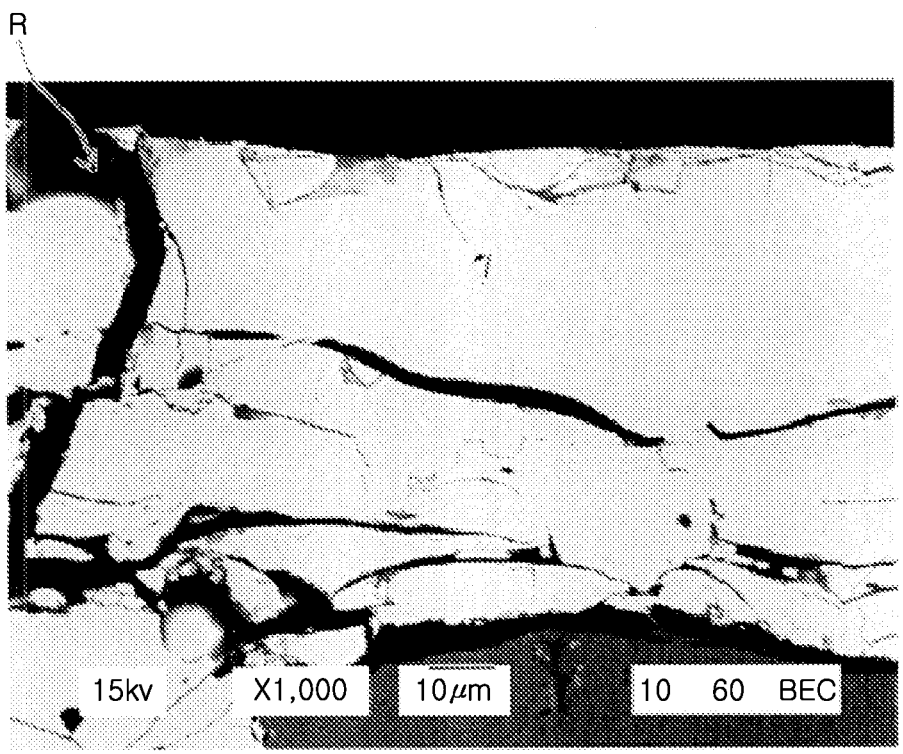
FIGS. 21A and 21B show cross-sectional SEM images of the thermal-sprayed films of $YF_3$ having different cross-sectional porosities after recrystallization in one embodiment of the present invention.
Figure 21B:
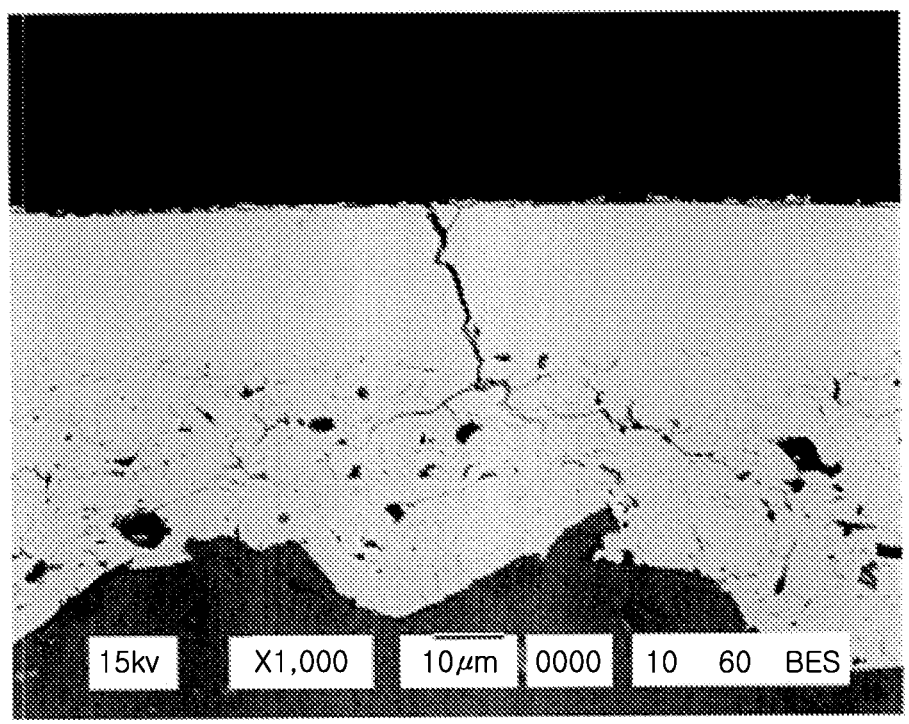

Next, the porosity of the thermal-sprayed film of $YF_3$ was examined. FIGS. 21A and 21B show cross-sectional SEM images of the thermal-sprayed films of $YF_3$ having different cross-sectional porosities after recrystallizing in one embodiment of the present invention. FIG. 21A shows a cross-sectional SEM image of the thermal-sprayed film of $YF_3$ having a cross sectional porosity of 12.8%. FIG. 21B shows a cross-sectional SEM image of the thermal-sprayed film of $YF_3$ having a cross sectional porosity of 3.2%. In the case of the cross sectional porosity of 12.8% shown in FIG. 21A, peeling R developed on a part of the recrystallized thermal-sprayed film of $YF_3$. On the other hand, in the case of the cross sectional porosity of 3.2% shown in FIG. 21B, the surface layer of the recrystallized thermal-sprayed film of $YF_3$ was densified and smoothened and, thus, no defect such as peeling or the like developed. As can be seen from the above test results, if the thermal-sprayed film of $YF_3$ before being melted has high porosity, the film is recrystallized in a state where pores are connected to one another by the melting of $YF_3$. As a result, cavities occur on a part of the thermal-sprayed film of $YF_3$, and the peeling R develops.

Further, a test for examining relationship between the porosity of the thermal-sprayed film of $YF_3$ and the occurrence of white marks and peeling was performed. The result thereof is shown in FIG. 22. When the porosity was in a range from 3% to 7%, no white marks or peeling developed on the surface layer of the thermal-sprayed film of $YF_3$. On the other hand, when the porosity was in a range from 9% to 15%, white marks or peeling developed on the surface layer of the thermal-sprayed film of $YF_3$.

Figure 23A:
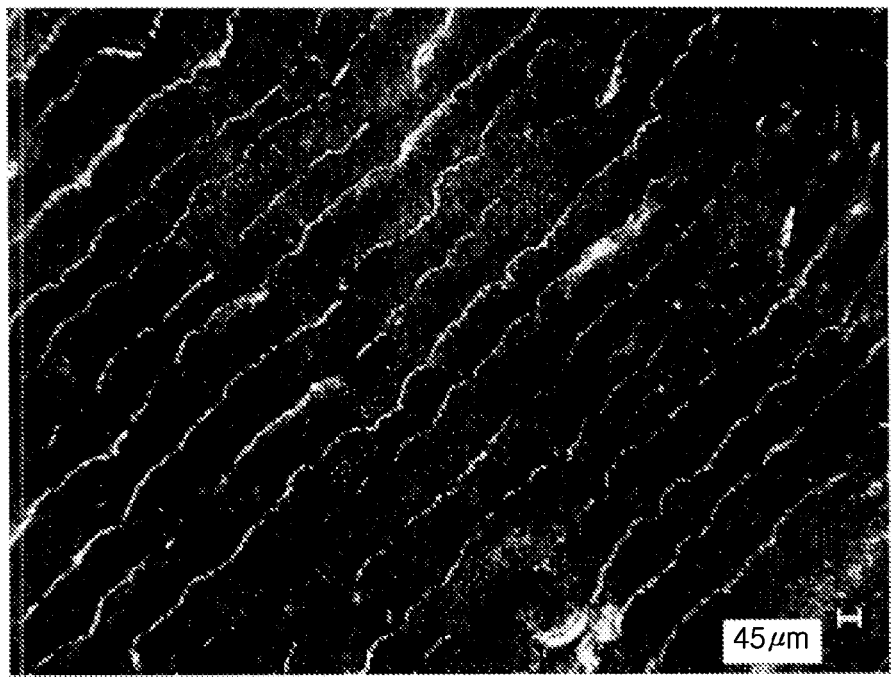
FIGS. 23A and 23B show SEM images of white marks generated on the surfaces obtained after the thermal-sprayed films of $YF_3$ has been recrystallized.
Figure 23B:
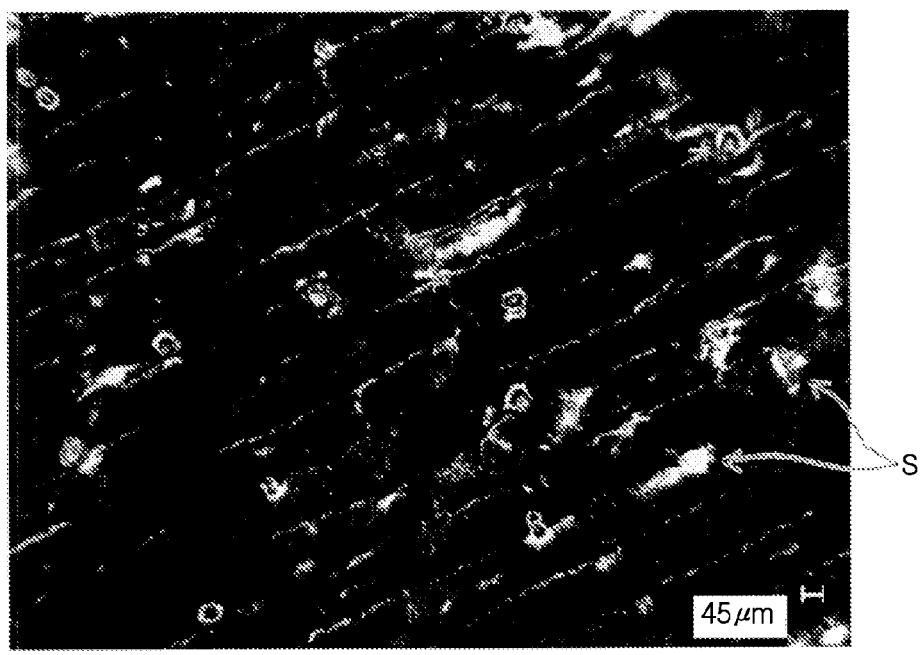

The examples of existence and non-existence of white marks are shown in, e.g., FIGS. 23A and 23B. FIGS. 23A and 23B show examples of SEM images of the surface layers of the thermal-sprayed films of $YF_3$ after melting the thermal-sprayed films of $YF_3$ by using electron beams and recrystallizing the melted films. FIG. 23A shows the case in which no white marks are generated, and FIG. 23B shows the case in which white marks S are generated. If the thermal-sprayed film of $YF_3$ before being melted has non-densified portions, a part of the thermal-sprayed film of $YF_3$ is not melted when electron beams are irradiated, and such part remains as the non-densified region on the surface layer of the thermal-sprayed film of $YF_3$ after recrystallization. The white marks S correspond to such non-densified portions on the surface of the thermal-sprayed film of $YF_3$. Since the thermal-sprayed film of $YF_3$ having the white marks is soft, particles may be easily generated and plasma resistance may be decreased.

(Transformation Test of Thermal-Sprayed Film of $YF_3$ by Plasma)

Figure 24:
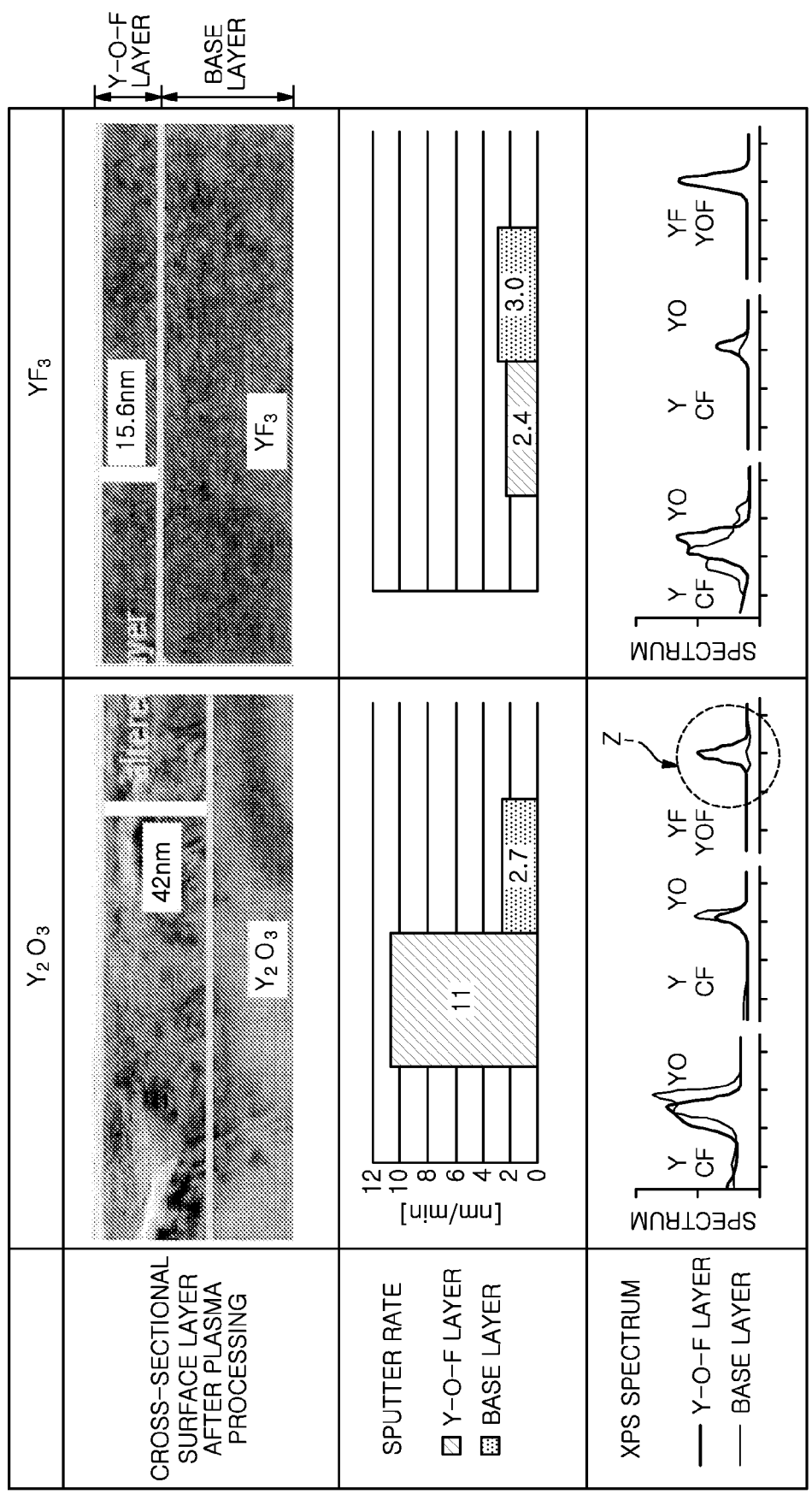
FIG. 24 shows a comparison between a Y—O—F layer of the thermal-sprayed film of $YF_3$ and a Y—O—F layer of the thermal-sprayed film $Y_2O_3$ in one embodiment of the present invention.

A transformation test of the thermal-sprayed film of $YF_3$ by a plasma was performed. This test was compared with the transformation test of the thermal-sprayed film of $Y_2O_3$ by a plasma. FIG. 24 shows the comparison result between the thermal-sprayed films of $YF_3$ and $Y_2O_3$ after an exposure to a plasma of a halogen-containing gas of $CF_4$ and a plasma of an $O_2$ gas.

The uppermost portion of FIG. 24 shows cross-sectional TEM images of surface layers of the coating films. Referring thereto, in the case of exposing the thermal-sprayed film of $Y_2O_3$ to the plasma, the outermost layer thereof was transformed to a depth of about 42 nm to be transformed into a Y—O—F layer. On the other hand, in the case of exposing the thermal-sprayed film of $YF_3$ to the plasma, the outermost layer thereof was transformed to a depth of 15.6 nm to be transformed into a Y—O—F layer. In other words, the thickness of the Y—O—F layer which was the outermost layer of the thermal-sprayed film of $YF_3$ was ⅓ of that of the Y—O—F layer which was the outermost layer of the thermal-sprayed film of $Y_2O_3$.

Therefore, for the problem of a generation of dust from the Y—O—F layer, the following conclusions can be deduced. Since the thickness of the Y—O—F layer of the thermal-sprayed film of $YF_3$ was thin, the generated particles had sizes smaller than 20 nm, which did not affect the process. On the contrary, since the thickness of the Y—O—F layer of the thermal-sprayed film of $Y_2O_3$ was thick, the generated particles had sizes greater than 20 nm, thus affecting the process.

The center portion of FIG. 24 shows sputter rates of base layers and Y—O—F layers of the coating films. Referring thereto, a sputter rate of the Y—O—F layer was highest when the base layer was the thermal-sprayed film of $Y_2O_3$. In other words, in the case where the base layer was the thermal-sprayed film of $Y_2O_3$, the Y—O—F layer that had been transformed by exposure to the plasma was soft and easily abraded. Therefore, it has been found that particles were easily generated and plasma resistance was decreased.

On the other hand, a sputter rate of the Y—O—F layer was low when the base layer was the thermal-sprayed film of $YF_3$. In other words, in the case where the base layer was the thermal-sprayed film of $YF_3$, the Y—O—F layer that had been transformed by exposure to the plasma was hardened due to its high density and was not easily abraded. Therefore, it has been found that particles were hardly generated, and plasma resistance was increased.

The lowermost part of FIG. 24 shows XPS (X-ray Photo electron Spectroscopy) spectrums indicating the composition of surface layers of the coating films. Referring thereto, in the surface layer of the thermal-sprayed film of $Y_2O_3$, a large amount of the thermal-sprayed film of $Y_2O_3$ was transformed into the Y—O—F at a depth of Z. The portion where the amount of transformation into the Y—O—F layer was large became particularly soft, so that it was expected that dust from the Y—O—F layer was easily generated in that portion.

On the other hand, in the thermal-sprayed film of $YF_3$, the portion where the amount of transformation from the thermal-sprayed film of $YF_3$ into the Y—O—F layer was extremely large was not observed. In other words, the Y—O—F layer of the thermal-sprayed film of $YF_3$ was thinner and denser than the Y—O—F layer of the thermal-sprayed film of $Y_2O_3$, so that dust was hardly generated. Further, even if the dust was generated, the sizes of particles were smaller than about 20 nm, which did not affect the process. From the above, it is clear that the Y—O—F layer, which was transformed from a base layer of a thermal-sprayed film of $YF_3$, had a high plasma resistance and, thus, dust generation was suppressed. Further, even if the dust was generated, it did not affect the process. For that reason, the Y—O—F layer of the thermal-sprayed film of $YF_3$ can be effectively used as a coating film.

Figure 25:
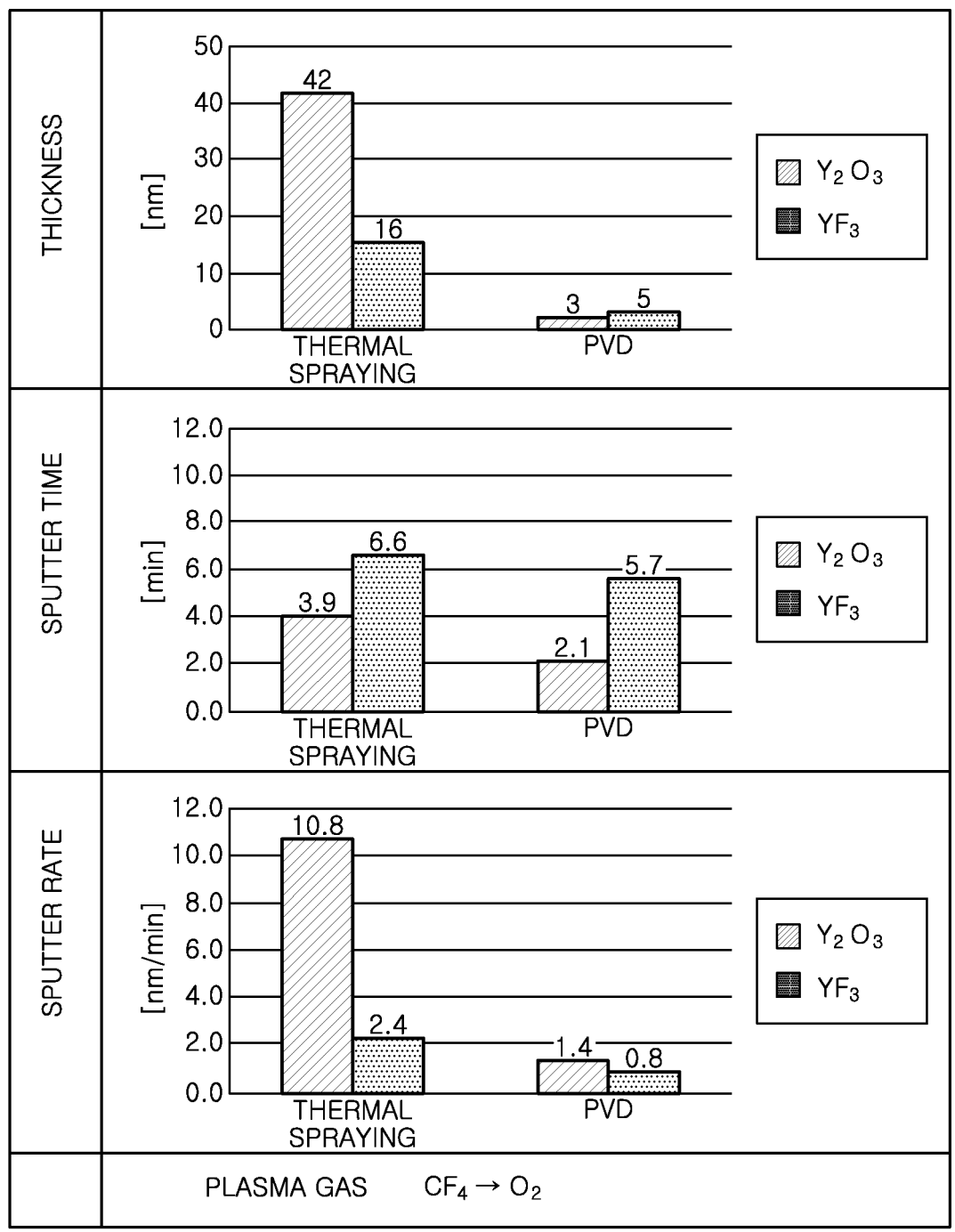
FIG. 25 shows a comparison result between in a case of sputtering the thermal-sprayed film of $YF_3$ and in a case of sputtering the thermal-sprayed film $Y_2O_3$ in one embodiment of the present invention.

In FIG. 25, a pair of left bar graphs and a pair of right bar graphs show results of sputtering of the Y—O—F layers on the surfaces of the coating films, which were formed by thermal spraying and PVD (physical vapor deposition) by the plasma of Ar gas, respectively. In each of the pair of left bar graphs and the pair of right bar graphs, a left bar shows the case of $Y_2O_3$ and a right bar shows the case of $YF_3$. Further, the graphs of FIG. 25 respectively show, from top to bottom, the thicknesses, the sputtering time and the sputtering rates of the Y—O—F layers of the thermal-sprayed films after the exposure to the plasmas of a $CF_4$ gas as a halogen-containing gas and an $O_2$ gas.

Referring thereto, in both of the thermal spraying and the PVD, the thermal-sprayed film of $YF_3$ has a thinner Y—O—F layer and a lower sputtering rate compared to the thermal-sprayed film of $Y_2O_3$. In other words, it is clear that the thermal-sprayed film of $YF_3$ is not easily transformed compared to the thermal-sprayed film of $Y_2O_3$, and the transformed Y—O—F layer is not easily sputtered.

It is also clear that the coating film formed by the PVD has a thinner Y—O—F layer and a lower sputtering rate compared to the coating film formed by the thermal spraying. In other words, the coating film formed by the PVD is not easily transformed compared to the coating film formed by the thermal spraying, and the transformed Y—O—F layer is not easily sputtered.

In other words, the various characteristics of the Y—O—F layer obtained depending on the film quality or the crystal structure of the thermal-sprayed film serving as a base layer formed by thermal spraying or the film formed by PVD or CVD (Chemical vapor Deposition) can be used. In the present embodiment, the film of $YF_3$ having a surface roughness Ra of 7.0 or less and a film cross section porosity of 8.0% or less is formed by using highly developed thermal spraying technique, PVD or CVD. Accordingly, no defects such as white marks, peeling and the like develop on the surface layer of the film of $YF_3$, and the high plasma resistance is ensured. Further, the Y—O—F layer as the surface layer of the film of $YF_3$ is thin and hard, so that dust is hardly generated. Even if the dust is generated, it will have no effect on the process since the particles generated during the process are smaller than about 20 nm.

From the above, it has been proved that the transformed Y—O—F layer of the thermal-sprayed film of $YF_3$ has superior characteristics than those of the transformed Y—O—F layer of the thermal-sprayed film of $Y_2O_3$. Further, it has been proved that there are various methods for forming the Y—O—F layer depending on the film quality or the crystal structure of the thermal-sprayed film. As a result, it has been found that it is preferable that the thermal-sprayed film of $YF_3$, having a surface roughness Ra of 7.0 or less and a film cross section porosity of 8.0% or less, is formed and an outermost layer thereof is transformed by the plasma to thereby form a Y—O—F layer. In this example, $CF_4$ gas has been described as an example of a halogen-containing gas. However, the halogen-containing gas is not limited thereto, and may be a single gas such as HBr gas or $Cl_2$ gas. A gaseous mixture of two or more gases selected among $CF_4$ gas, HBr gas and $Cl_2$ gas may be used for the halogen-containing gas. In that case, the Y—O—F layer as a transformed layer further contains Cl or Br.

CONCLUSION

While the embodiments of the plasma processing apparatus and the plasma processing method of the present invention have been described in detail with reference to the accompanying drawings, the present invention is not limited thereto. It will be understood by those skilled in the art that various changes and modifications may be made without departing from the scope of the invention as defined in the following claims. It is obvious that such changes and modifications are also included in the technical range of the plasma processing apparatus and the plasma processing method of the present invention.

For example, in the present invention, the fluorinated compound formed on the surface exposed to the plasma is not limited to a thermal-sprayed film formed by thermal spraying or plasma spraying, and may also be formed by CVD or PVD. The fluorinated compounds thereof may be laminated by CVD or PVD.

The outermost layer of the fluorinated compound may be melted by irradiation of energy rays and then recrystallized. Accordingly, the generation of particles may be further suppressed.

The plasma processing of the present invention which is performed by the plasma processing apparatus is not limited to etching, and may also be film formation, ashing, sputtering or the like.

The plasma processing apparatus of the present invention is not limited to a parallel plate type plasma processing apparatus and may also be used for an a semiconductor manufacturing apparatus having an antenna electrode opposite to a lower electrode, such as an ICP (inductively coupled plasma) semiconductor manufacturing apparatus, a microwave semiconductor manufacturing apparatus for generating a microwave excitation surface wave plasma including an SPA (Slot Plane Antenna) plasma, or a microwave plasma generated by a radial line slot antenna.

When the film thickness of the fluorinated compound is 300 μm or above, the fluorinated compound is easily peeled off from the base layer due to the thermal expansion difference between the film of the fluorinated compound and the base layer. Thus, the film thickness of the fluorinated compound is preferably less than 300 μm, and more preferably less than 200 μm.

The target object to be processed in the present invention is not limited to a (semiconductor) wafer described in the above embodiments, and may also be, e.g., a large-scale substrate such as a flat panel display, an EL device or a substrate for a solar cell.

While the invention has been shown and described with respect to the embodiments, it will be understood by those skilled in the art that various changes and modification may be made without departing from the scope of the invention as defined in the following claims.

What is claimed is:

1. A plasma processing apparatus for generating a plasma of a gas and performing a plasma processing on a target object to be processed by an action of the plasma, comprising:
   a depressurizable processing chamber;
   a lower electrode, provided in the processing chamber, serving as a mounting table for mounting thereon the target object;
   a facing electrode, serving as an upper electrode or an antenna electrode provided at the processing chamber so as to be opposite to the lower electrode;
   a gas supply source for introducing a gas including a halogen-containing gas and an oxygen gas into the processing chamber; and
   a plasma generation unit for generating a plasma of the gas including the halogen-containing gas and the oxygen gas in the processing chamber,
   wherein, among inner surfaces of the processing chamber which are exposed to the plasma of the gas including the halogen-containing gas and the oxygen gas, at least a part of or all of the surfaces between a mounting position of the target object and the facing electrode; or at least a part of or all of the surfaces of the facing electrode are coated with a fluorinated compound,
   wherein the fluorinated compound contains $YF_3$, and
   wherein an outermost layer of the fluorinated compound is transformed into a transformed layer containing Y, O and F or containing Y, O, F and at least one of Cl and Br by the plasma of the gas including the halogen-containing gas and the oxygen gas.

2. The plasma processing apparatus of claim 1, wherein the transformed layer has a thickness of 20 nm or less.

3. The plasma processing apparatus of claim 1, wherein the fluorinated compound is formed by a thermal spraying, a physical vapor deposition, or a chemical vapor deposition.

4. The plasma processing apparatus of claim 1, wherein the material of the fluorinated compound contains Al or Si.

5. The plasma processing apparatus of claim 1, wherein the fluorinated compound is directly formed on a metal base, or the fluorinated compound is formed on an outermost layer through one or more insulating films.

6. The plasma processing apparatus of claim 5, wherein the fluorinated compound is directly formed on any one of an Al base, an $Y_2O_3$ film, or an $Al_2O_3$ film.

7. The plasma processing apparatus of claim 1, wherein the fluorinated compound has a film thickness smaller than 300 μm.

8. The plasma processing apparatus of claim 1, wherein the fluorinated compound has a film thickness smaller than 200 μm.

9. The plasma processing apparatus of claim 1, wherein an outermost layer of the fluorinated compound is melted by an irradiation of energy rays and then crystallized.

10. The plasma processing apparatus of claim 1, wherein, among the inner surfaces of the processing chamber which are exposed to the plasma, a part of or all of the surfaces located between the facing electrode and a baffle plate are coated with the fluorinated compound.

11. The plasma processing apparatus of claim 1, wherein, among the inner surfaces of the processing chamber which are exposed to the plasma, an inner surface to be coated with the fluorinated compound is determined by a gap between the mounting table and a ceiling surface of the processing chamber.

12. The plasma processing apparatus of claim 1, wherein a surface of at least one of a deposition shield, a shutter, a baffle plate, or a ring bottom shield provided in the processing chamber, the surface being exposed to the plasma of the gas including the halogen-containing gas and the oxygen gas, is coated with the fluorinated compound.

13. The plasma processing apparatus of claim 1, wherein a side surface of an electrostatic chuck on the mounting table is coated with the fluorinated compound, or the side surface and a top surface of the electrostatic chuck are coated with the fluorinated compound.

14. The plasma processing apparatus of claim 1, wherein a top surface of a focus ring provided to surround a peripheral portion of the target object mounted on the mounting table is coated with the fluorinated compound.

15. A plasma processing method for use with a plasma processing apparatus which includes a depressurizable processing chamber; a lower electrode provided in the processing chamber and serving as a mounting table for mounting thereon a target object to be processed; a facing electrode, serving as an upper electrode or an antenna electrode, provided in the processing chamber so as to be opposite to the lower electrode; a gas supply source for introducing a gas including a halogen-containing gas and an oxygen gas into the processing chamber; and a plasma generation unit for generating a plasma of the gas including the halogen-containing gas and the oxygen gas in the processing chamber, the plasma processing method comprising:

introducing the gas including the halogen-containing gas and the oxygen gas from the gas supplying source into the processing chamber in which, among inner surfaces of the processing chamber which are exposed to the plasma of the gas including the halogen-containing gas and the oxygen gas, at least a part of or all of the surfaces between a mounting position of the target object and the facing electrode; or at least a part of or all of the surfaces of the facing electrode are coated with a fluorinated compound;

generating the plasma of the gas including the halogen-containing gas and the oxygen gas by using the plasma generation unit; and performing a plasma processing on the target object mounted on the mounting table by an action of the plasma of the gas including the halogen-containing gas and the oxygen gas, wherein a material forming the fluorinated compound contains $YF_3$, and wherein an outermost layer of the fluorinated compound is transformed into a transformed layer containing Y, O and F or containing Y, O, F and at least one of Cl and Br by the plasma of the gas including the halogen-containing gas and the oxygen gas.

16. The plasma processing apparatus of claim 1, wherein a thermally sprayed film of $Y_2O_3$ is formed beneath the fluorinated compound, and a thickness of the fluorinated compound is equal to or less than that of the thermally sprayed film of $Y_2O_3$.

17. The plasma processing apparatus of claim 1, a surface roughness of the fluorinated compound is equal to or less than 7.0 μm.

18. The plasma processing apparatus of claim 1, a porosity of the fluorinated compound is in a range from 3% to 7%.

19. The plasma processing apparatus of claim 15, wherein a thermally sprayed film of $Y_2O_3$ is formed beneath the fluorinated compound, and a thickness of the fluorinated compound is equal to or less than that of the thermally sprayed film of $Y_2O_3$.

20. The plasma processing apparatus of claim 15, a surface roughness of the fluorinated compound is equal to or less than 7.0 μm.

21. The plasma processing apparatus of claim 15, a porosity of the fluorinated compound is in a range from 3% to 7%.

* * * * *